(12) United States Patent
Yokozeki et al.

(10) Patent No.: US 7,080,270 B2
(45) Date of Patent: Jul. 18, 2006

(54) MULTI-THRESHOLD-VOLTAGE INTEGRATED CIRCUIT HAVING A NON-VOLATILE DATA STORAGE CIRCUIT

(75) Inventors: Wataru Yokozeki, Kunitachi (JP); Shoichi Masui, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 499 days.

(21) Appl. No.: 10/647,432

(22) Filed: Aug. 26, 2003

(65) Prior Publication Data
US 2004/0085846 A1    May 6, 2004

(30) Foreign Application Priority Data
Aug. 27, 2002  (JP)  ............... 2002-247346

(51) Int. Cl.
*G06F 1/32*   (2006.01)
*G11C 11/22*  (2006.01)

(52) U.S. Cl. ..................... 713/320; 365/145
(58) Field of Classification Search ........... 713/300, 713/320; 365/65, 109, 145
See application file for complete search history.

(56) References Cited

U.S. PATENT DOCUMENTS 5,781,062 A * 7/1998 Mashiko et al. ........... 327/544
6,900,478 B1 * 5/2005 Miyagi ....................... 257/202

FOREIGN PATENT DOCUMENTS

JP       10-078836     3/1998
JP      2001-093275    4/2001
JP    2003203475 A  *  7/2003

OTHER PUBLICATIONS

"Technology for a Low Power Consumption, High-Speed LSI" Realize Inc., pp. 60-74.
"A 512 Kbit low-voltage NV-SRAM with the size of a conventional SRAM" 2001 Symposium on VLSI Circuits Digest of Technical Papers.

* cited by examiner

*Primary Examiner*—Thomas Lee
*Assistant Examiner*—Mark Connolly
(74) *Attorney, Agent, or Firm*—Arent Fox PLLC

(57) ABSTRACT

An integrated circuit has a sleep switch, provided between a first power line and a second power line, which is constituted by a transistor of a first threshold voltage, and which becomes non-conducting in a sleep mode, and further has a latch circuit, connected to the second power line, which is constituted by a transistor of a second threshold voltage which is lower than the first threshold voltage, and a ferroelectric capacitor for storing data held in the latch circuit in accordance with the polarization direction of a ferroelectric film thereof. The integrated circuit also comprises a control signal generating circuit which, when returning to an active mode from the sleep mode, generates a plate signal for driving a terminal of the ferroelectric capacitor to generate a voltage in the latch circuit in accordance with the polarization direction, and generates a sleep signal for causing the sleep switch to conduct to thereby activate the latch circuit following the driving of the ferroelectric capacitor.

18 Claims, 16 Drawing Sheets

MULTI-THRESHOLD-VOLTAGE INTEGRATED CIRCUIT HAVING A NON-VOLATILE DATA STORAGE CIRCUIT

CROSS-REFERENCE TO RELATED APPLICATIONS

This application is based upon and claims the benefit of priority from the prior Japanese Patent Application No. 2002-247346, filed on Aug. 27, 2002, the entire contents of which are incorporated herein by reference.

BACKGROUND OF THE INVENTION

1. Field of the Invention

The present invention relates to an integrated circuit provided with a nonvolatile data storage circuit in a multi-threshold-voltage CMOS for enabling low power consumption, and more particularly to an integrated circuit which is capable of simplifying a power supply layout and avoiding erroneous operations during a data recall operation.

2. Description of the Related Art

A multi-threshold-voltage CMOS (MTCMOS) has been proposed as technology for reducing power consumption in an LSI (large-scale integrated circuit). According to this MTCMOS technology, as described in non-patent document 1, for example, which will be described herein below, the high current driving capability of a low-Vth transistor and the low leakage quality of a high-Vth transistor are used to enable high-speed operations and low power consumption. For example, high-speed operations are enabled by constructing a combinational logic circuit having a predetermined function with a low-Vth transistor. In the low-Vth transistor, however, leakage current is generated during standby period or sleep mode period (to be referred to as "sleep mode" hereinafter), leading to an increase in power consumption. Hence an artificial power supply line (virtual power supply line) connected to a high power supply VDD or low power supply VSS via a sleep switch is provided and the combinational logic circuit is connected to this artificial power supply line such that during sleep mode, leakage current is suppressed by switching the sleep switch off. The sleep switch is constituted by a high-Vth transistor, and thus the generation of leakage current when the sleep switch is off can be suppressed.

Hence according to MTCMOS technology, leakage current can be suppressed by switching off the sleep switches of a part of or all of the circuits during sleep mode. Since no power supply voltage is supplied, however, a problem arises in that the data held in the latches and flip-flops inside the circuit become volatile.

As a technique for solving this problem, a balloon-type data holding circuit has been proposed. An MTCMOS circuit having a balloon-type data holding circuit is disclosed in non-patent document 1, for example, which will be described hereinafter, and is as shown in the circuit diagram of a conventional example in FIG. 1. In this example, a combinational circuit 1 and a latch circuit 2 are constituted by low-Vth transistors and are capable of high-speed operations. A virtual power supply voltage VVdd which is connected to a normal power supply voltage Vdd via a sleep switch SSW is connected to these circuits 1, 2. The sleep switch SSW is constituted with a high-Vth, and in sleep mode enters a non-conducting state due to the L level of a sleep control signal SLP, thus suppressing leakage current in the combinational circuit 1 and latch circuit 2.

The data held in the latch circuit 2 should desirably be nonvolatile even in sleep mode. Thus, a balloon latch circuit 3 is connected to the latch circuit 2 such that when switching from active mode to sleep mode, the data held in the latch circuit 2 are sheltered or evacuated inside the balloon latch circuit 3. Since the normal power supply voltage Vdd is connected to the balloon latch circuit 3, power supply voltage is supplied to the latch circuit 3 even in sleep mode, and thus the sheltered data can be held. In order to suppress leakage current during sleep mode, the balloon latch circuit 3 is also constituted by a high-Vth transistor. When sleep mode returns to active mode, the data in the balloon latch circuit 3 are restored to the latch circuit 2. As a result, the latch circuit 2 becomes a nonvolatile latch circuit.

Non-patent Document 1

"Technology for a Low Power Consumption, High-Speed LSI", Realize Inc., pages 60–74

Non-patent Document 2

T. Miwa et al. "A 512 Kbit Low-voltage NV-SRAM with the size of a conventional SRAM", 2001 Symposium on VLSI Circuit Digest of Technical Papers In the MTCMOS circuit having a balloon-type data holding circuit illustrated in FIG. 1, however, the normal power line Vdd and virtual power line VVdd are mixed together, and therefore this example is not suited to an automatic layout. When a nonvolatile latch circuit is disposed in a plurality of positions within an integrated circuit, for example, a balloon latch circuit 3 must be disposed adjacent to each nonvolatile latch circuit 2. As a result, the normal power line Vdd and virtual power line VVdd become mixed together over the entire chip, which complicates the layout and is therefore disadvantageous as regards the degree of integration.

Moreover, the combinational circuit 1 and nonvolatile latch circuit 2 are constituted by low-Vth transistors, whereas the balloon latch circuit 3 is constituted by a high-Vth transistor. As a result, transistors of differing threshold voltages are mixed together, and since it is necessary to keep a sufficient distance on the chip between these transistors due to structural differences, a problem arises in that the degree of integration deteriorates.

It is therefore desirable to eliminate the need for the normal power supply Vdd and the need for a high-Vth transistor in the balloon latch circuit 3.

The aforementioned non-patent document 2 describes nonvolatile SRAM (Static Random Access Memory) having a memory cell in which a variable capacitance capacitor using ferroelectric film (to be referred to as "ferroelectric capacitor" hereinafter) is connected to a latch circuit. In this nonvolatile SRAM memory cell, a ferroelectric capacitor is connected to each of a pair of storage nodes of the latch circuit which are cross connected to the input and output of a pair of inverters, and the H level and L level of the pair of storage nodes in the latch circuit are stored in the ferroelectric capacitor. Hence, even when power is off, the data in the memory cell are held in the ferroelectric capacitor in differing directions of polarization. When the power is switched on again, the latch circuit of the memory cell recovers in accordance with the polarization direction of the ferroelectric capacitor.

When the power is switched on again in the nonvolatile latch circuit employed in the nonvolatile SRAM of non-patent document 2, however, a problem arises in that the data to be recovered tend to invert due to irregularities in the transistor characteristic of the latch circuit. Inventions designed to solve this problem have been filed previously by the present inventor. For example, Japanese Patent Application No. H13-400507 (filed Jan. 28, 2001). The latch circuit in this prior application, however, does not employ MTCMOS technology.

It is therefore an object of the present invention to provide a low power consumption integrated circuit using MTCMOS technology, and more particularly to provide an integrated circuit having a nonvolatile data storage circuit and simplified power source wiring and transistor constitutions.

SUMMARY OF THE INVENTION

In order to achieve the aforementioned object, a first aspect of the present invention is an integrated circuit having a sleep switch, provided between a first power line and a second power line, which is constituted by a transistor of a first threshold voltage, and which becomes non-conducting in a sleep mode, and further comprising a latch circuit, connected to the second power line, which is constituted by a transistor of a second threshold voltage which is lower than the first threshold voltage, and a ferroelectric capacitor for storing data held in the latch circuit in accordance with the polarization direction of a ferroelectric film thereof. The integrated circuit also comprises a control signal generating circuit which, when returning to an active mode from the sleep mode, generates a plate signal for driving a terminal of the ferroelectric capacitor to generate a voltage in the latch circuit in accordance with the polarization direction, and generates a sleep signal for causing the sleep switch to conduct to thereby activate the latch circuit following the driving of the ferroelectric capacitor.

According to this first aspect of the present invention, a ferroelectric capacitor for holding data held by a nonvolatile latch circuit during sleep mode is provided in an integrated circuit constructed using MTCMOS technology, and a sleep switch for switching the power supply off during sleep mode is used as an activation circuit for activating the latch circuit when recovering from sleep mode. More specifically, at a timing when the other ferroelectric capacitor terminal is driven to produce voltages in the pair of terminals of the latch circuit, the sleep switch is caused to conduct, thereby activating the latch signal, and data pertaining to the difference between these voltages are then latched. As a result, the latch circuit can securely restore the data. Further, since there is no need to connect the first power line to the ferroelectric capacitor, the power line layout is simplified. Since the ferroelectric capacitor does not require a high-Vth transistor, the circuit element area can be reduced. Only the sleep switch is constituted by a high-Vth transistor, and therefore the number of transistors with high-Vth may be reduced.

A second aspect of the present invention in order to achieve the aforementioned object is an integrated circuit having a sleep switch, provided between a first power line and a second power line, which is constituted by a transistor of a first threshold voltage, and which becomes non-conducting in a sleep mode, wherein the first and second power supply lines and the sleep switch are provided on each of a high power supply line side and a low power supply line side. The integrated circuit further comprises a latch circuit connected to the second high power supply line and low power supply line and constituted by a transistor of a second threshold voltage which is lower than the first threshold voltage, a ferroelectric capacitor for storing data held in the latch circuit in accordance with the polarization direction of a ferroelectric film thereof, and a control signal generating circuit which, when returning to an active mode from the sleep mode, generates a plate signal for driving a terminal of the ferroelectric capacitor to generate a voltage in the latch circuit in accordance with the polarization direction, and generates a sleep signal for causing the pair of sleep switches on the high power supply line side and low power supply line side to conduct to thereby activate the latch circuit following the driving of the ferroelectric capacitor.

According to this second aspect, the pair of sleep switches provided on the high power supply line side and the low power supply line side is caused to conduct in order to activate the latch circuit, and thus the latch circuit is able to securely latch the voltage produced in accordance with the state of polarization of the ferroelectric capacitor.

In a preferable embodiment of this aspect of the invention, the ferroelectric capacitor comprises at least a pair of ferroelectric capacitors, one terminal of each ferroelectric capacitor being connected to a pair of storage terminals of the latch circuit. The plate signal drives the other terminal of the ferroelectric capacitors. As a result of this driving, a voltage difference in accordance with the polarization directions of the ferroelectric capacitors is generated in the pair of storage terminals of the latch circuit.

In a preferable embodiment of this aspect of the invention, the ferroelectric capacitor comprises two pairs of ferroelectric capacitors, one terminal of each ferroelectric capacitor being connected to the pair of storage terminals of the latch circuit. The other terminals of one of the ferroelectric capacitors of the ferroelectric capacitor pair connected to each storage terminal of the latch circuit are driven by the plate signal. As a result of this driving, a voltage difference in accordance with the polarization directions of the ferroelectric capacitor pair connected to each storage terminal is generated in the pair of storage terminals of the latch circuit. By providing a ferroelectric capacitor pair for each of the storage terminals of the latch circuit, the difference between the voltages generated by the driving performed by the plate signal increases, whereby a data recall operation can be performed with a higher degree of precision.

DESCRIPTION OF THE PREFERRED EMBODIMENTS

An embodiment of the present invention will be described below with reference to the drawings. However, the scope of protection of the present invention is not limited to or by the following embodiment, but covers the inventions described in the patent claims and equivalent items thereto.

Figure 1:
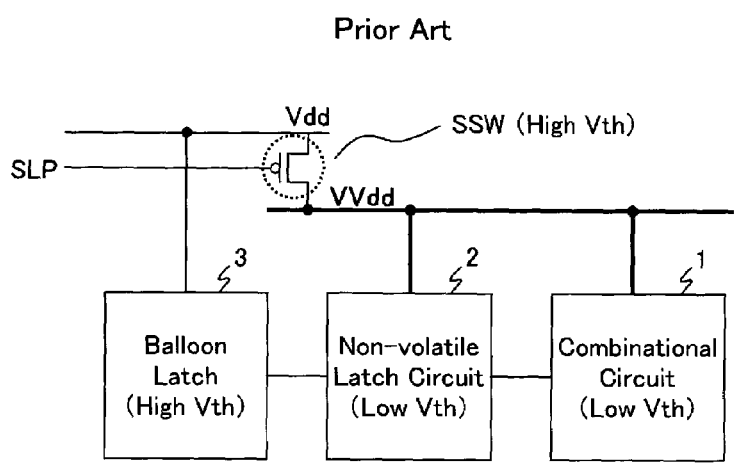
FIG. 1 is a view showing an example of a circuit diagram according to a conventional example of MTCMOS technology.
Figure 2:
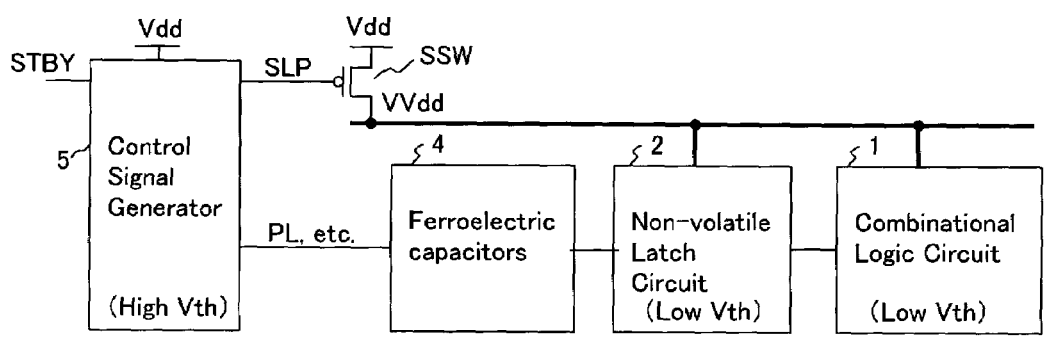
FIG. 2 is a schematic constitutional diagram of an integrated circuit in this embodiment.

FIG. 2 is a schematic constitutional diagram of an integrated circuit in this embodiment. Similarly to the example in FIG. 1, a normal power supply Vdd and a virtual power supply VVdd are connected via a sleep switch SSW, and a combinational logic circuit 1 and nonvolatile latch circuit 2 are connected to the virtual power supply VVdd. The sleep switch SSW is constituted by a high-Vth transistor, whereas the combinational logic circuit 1 and nonvolatile latch circuit 2 are constituted by low-Vth transistors.

The integrated circuit of this embodiment is provided with a ferroelectric capacitor 4 for holding the data held in the nonvolatile latch circuit 2 even when the sleep switch SSW becomes non-conducting. As will be described below, the ferroelectric capacitor is capable of holding the data held in the latch circuit by using the characteristics of ferroelectric film whereby the polarization direction thereof is preserved even when power is off. When the latch circuit data is recorded or when the data is restored to the latch circuit, the ferroelectric capacitor 4 is driven by a plate signal PL. The ferroelectric capacitor 4 is only connected to the latch circuit 2 and does not need to be connected to the normal power supply Vdd or virtual power supply VVdd.

A control signal generating circuit 5 is constituted by a high-Vth transistor and is supplied with the normal power supply Vdd. Hence even in sleep mode, the control signal generating circuit 5 is in an operative state. The control signal generating circuit 5 generates the plate signal PL which is supplied to the ferroelectric capacitor 4, asleep signal SLP for controlling the sleep switch SSW, and so on.

A summary of the operations of the circuit in FIG. 2 is as follows. In active mode, the sleep signal SLP switches to L level, the sleep switch SSW, which is P channel transistor, enters a conducting state, and the virtual power supply VVdd is connected to the normal power supply Vdd. Thus the combinational logic circuit 1 and the latch circuit 2 are supplied with power to perform normal operations. In response to an external standby signal STBY, prior to entering sleep mode, the control signal generating circuit 5 generates the plate signal PL, whereby the ferroelectric capacitor 4 holds the data held in the latch circuit 2 using the polarization direction thereof. The sleep signal SLP then becomes H level so that the sleep switch SSW enters a non-conducting state. Since the sleep switch SSW is a high-Vth transistor, the amount of leakage current is small, and thus leakage current in sleep mode can be suppressed. In sleep mode, the latch circuit is unable to hold data, but the polarization direction of the ferroelectric capacitor is maintained as its residual polarization.

When sleep mode returns to active mode in response to the standby signal STBY, the control signal generating circuit 5 drives the plate signal PL such that a predetermined voltage is generated in a terminal of the latch circuit 2 in accordance with the polarization state held by the ferroelectric capacitor 4. After making this state, the control signal generating circuit 5 drives the sleep signal SLP to L level to there by activate the latch circuit 2, whereupon the generated voltage level is restored by the latch circuit 2. This is a recall operation.

Thus the sleep switch SSW is provided with a function for switching between sleep mode and active mode, and a function for activating the latch circuit 2 by means of a recall operation when returning to active mode from sleep mode. Hence in this embodiment, leakage current in sleep mode can be suppressed, and a latching operation of the data in the ferroelectric capacitor performed by the latch circuit during the recall operation can be performed surely.

Figure 3:
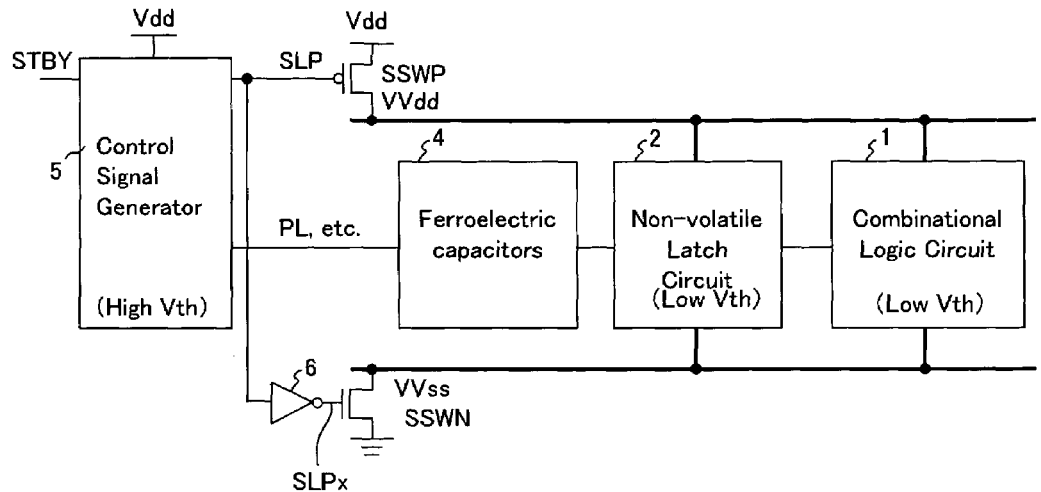
FIG. 3 is a schematic constitutional diagram of an integrated circuit in this embodiment.

FIG. 3 is a schematic constitutional diagram of the integrated circuit of this embodiment. This circuit differs from the integrated circuit in FIG. 2 in that the normal power supply and virtual power supply, and the sleep switch by which they are connected, are provided at each a high voltage power Vdd side and a low voltage power Vss side, and remaining are identical. Thus a sleep switch SSWP constituted by a P-channel transistor is provided between the normal power supply Vdd and virtual power supply VVdd on the high voltage side, and a sleep switch SSWN constituted by an N-channel transistor is provided between the normal power supply Vss and the virtual power supply VVss on the low voltage side (ground side), and these sleep switches are respectively supplied with sleep signals SLP, SLPx each having an opposite level from the control signal generating circuit 5. The sleep signal SLPx is generated by inverting the signal SLP using an inverter 6.

In the example in FIG. 3, when active mode is returned to from sleep mode, the ferroelectric capacitor is driven by the plate signal PL and with voltages in accordance with the residual polarization direction thereof are generated in the latch circuit 2, and then, in this state, the sleep signals SLP, SLPx are driven to L level and H level respectively such that high and low power supply voltages are supplied to the latch circuit 2. Thereupon, the latch circuit 2 performs a latching operation to restore the data. By performing a latching operation in which high and low power supply voltages are supplied simultaneously, data can be latched more securely.

In other words, the ferroelectric capacitor 4 functions as a data holding circuit for holding the data in the latch circuit 2. During sleep mode, when no power is supplied, the ferroelectric capacitor 4 is capable of holding data using the polarization direction of the ferroelectric film.

Figure 4:
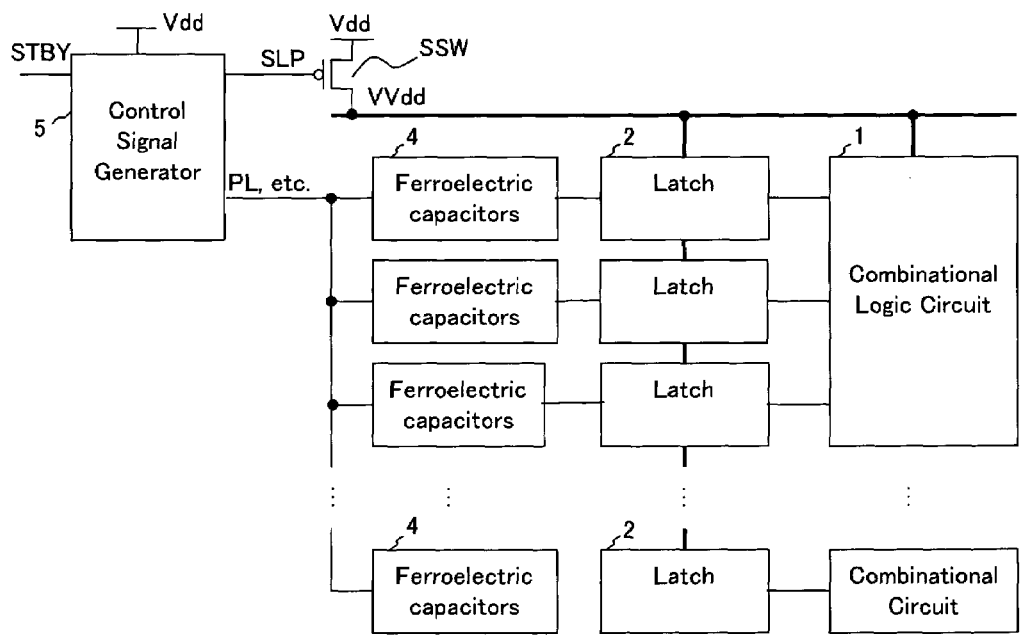
FIG. 4 is another schematic constitutional diagram of an integrated circuit in this embodiment.
Figure 5:
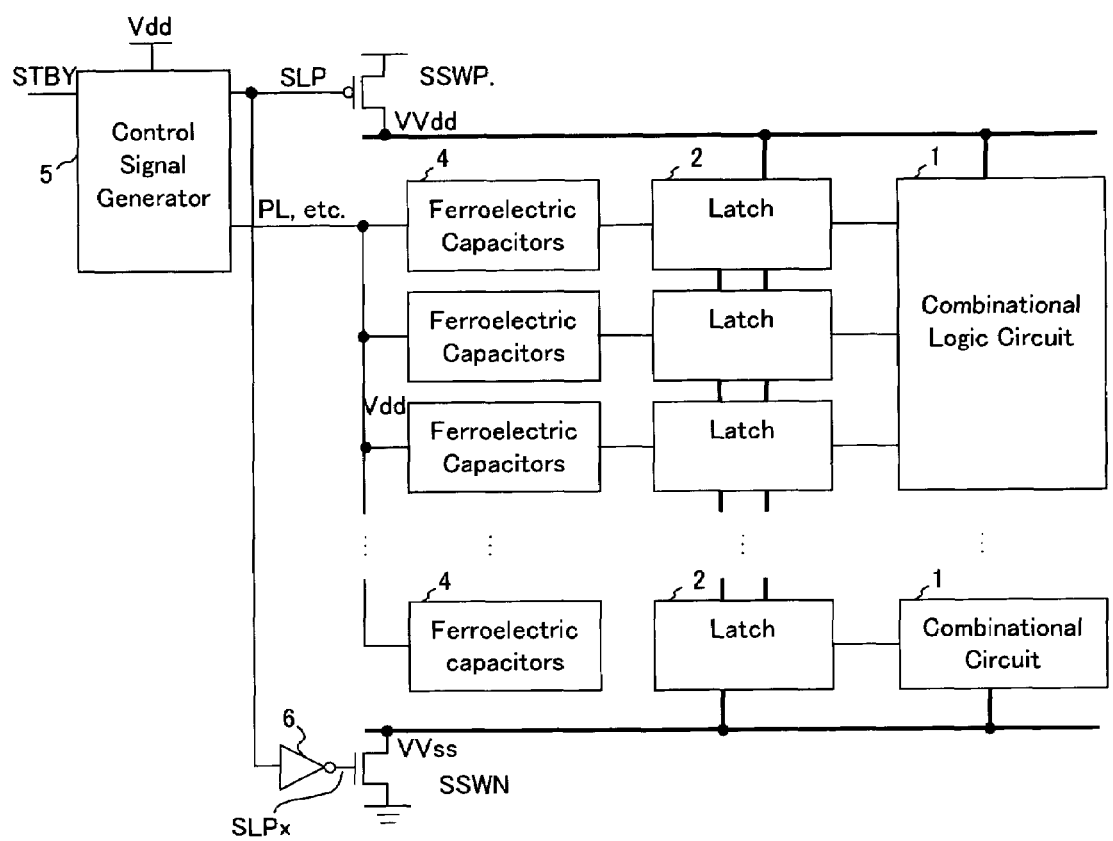
FIG. 5 is another schematic constitutional diagram of an integrated circuit in this embodiment.

FIGS. 4 and 5 are other schematic constitutional diagrams of the integrated circuit of this embodiment. In these examples, a plurality of latch circuits 2 exist in the integrated circuit, and each latch circuit is provided with a ferroelectric capacitor 4 for holding the data in the latch circuits. When a common sleep switch SSW is set in a conducting state, the plurality of latch circuits 2 are activated. The control signal generating circuit 5 controls the store operation when sleep mode is entered and the recall operation when active mode is returned to all at once by supplying the plate signal PL and so on in common to the plurality of ferroelectric capacitors 4. In the example in FIG. 5, similarly to FIG. 3, the sleep switches SSWP, SSWN are provided respectively on the high and low power sides.

Figure 6:
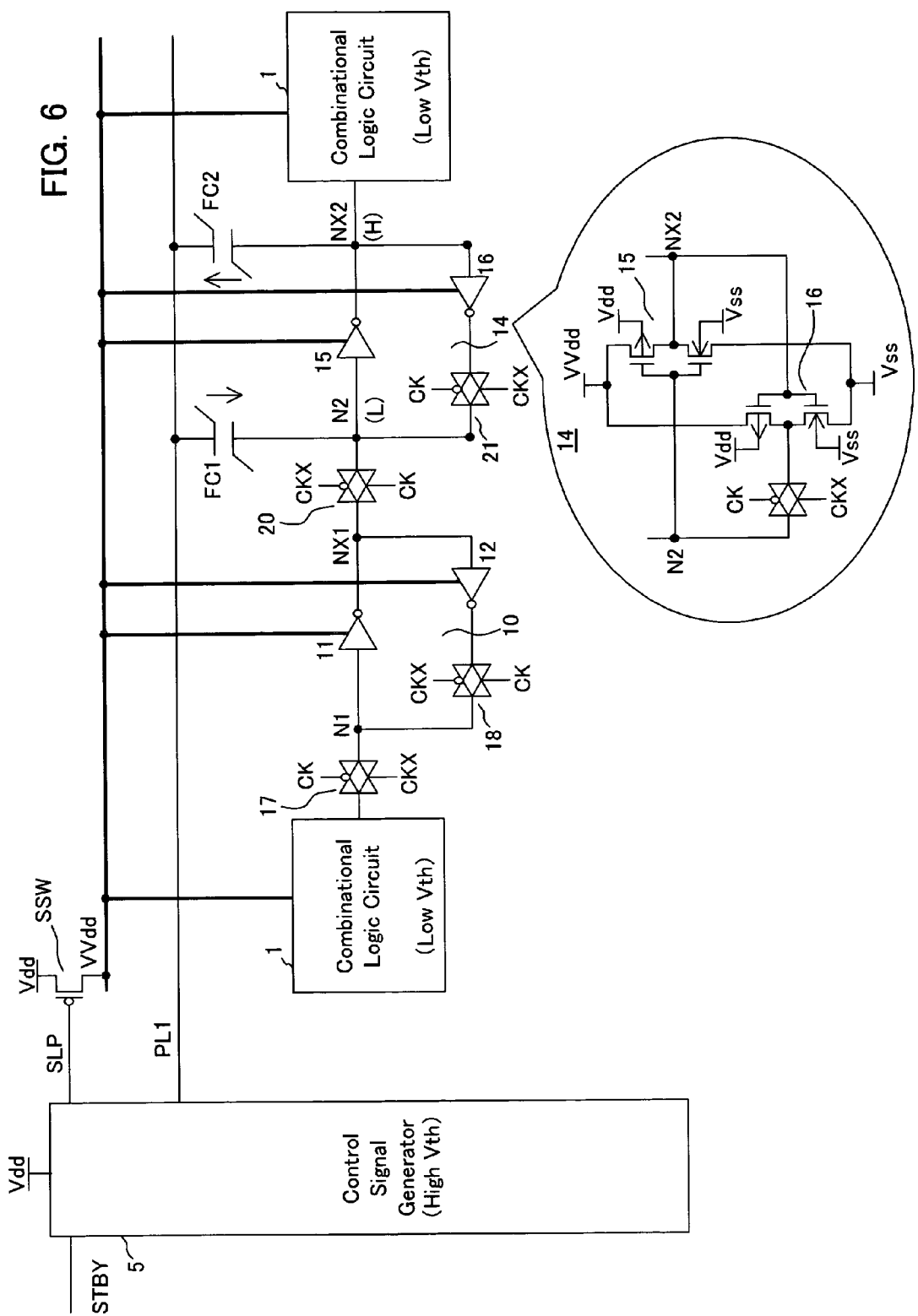
FIG. 6 is a circuit diagram showing an example of the nonvolatile latch circuit in FIG. 2.

FIG. 6 is a circuit diagram showing an example of the nonvolatile latch circuit, the ferroelectric capacitors, the control signal generator, and the combination logic circuit of FIG. 2. In FIG. 6, a D-type flip-flop constituted by a master latch circuit 10 and a slave latch circuit 14 is shown. The output of the combinational logic circuit 1 is inputted into the master latch circuit 10 through a CMOS transfer gate 17, and the output of the master latch circuit 10 is connected to the slave latch circuit 14 through a CMOS transfer gate 20. Each latch circuit 10, 14 is provided with a pair of inverters 11, 12, 15, 16 and a CMOS transfer gate 18, 21.

Thus the output of the combinational logic circuit 1 is supplied to a node N1 synchronously with the falling edge of a clock CK (the rising edge of an antiphase clock CKX), and this output is latched by the master latch circuit 10 synchronously with the rising edge of the clock CK. Further, the output of the inverter 11 is supplied to the node N2 synchronously with the rising edge of the clock CK, and this output is latched by the slave latch circuit 14 synchronously with the next falling edge of the clock CK. The data in a node NX2 are supplied to the latter stage combinational logic circuit 1.

In the example in FIG. 6, the opposite phase data stored in the pair of storage terminals N2, NX2 of the slave latch circuit 14 in the D flip-flop may be held in the ferroelectric capacitors FC1, FC2 which are respectively connected to this pair of storage terminals N2, NX2.

The CMOS circuit of the slave latch circuit 14 is shown in detail in FIG. 6. An inverter 15 is constituted by P-channel and N-channel transistors, and the substrates thereof (an n-type semiconductor in the case of a P-channel MOS and a p-type semiconductor in the case of an N-channel MOS) are connected to the power supply Vdd and a ground Vss respectively. An inverter 16 is also constituted by P-channel and N-channel transistors, the substrates thereof being connected to a power supply Vdd and a ground Vss respectively. The source electrodes of the P-channel transistors are connected to a virtual power supply VVdd.

Figure 15:
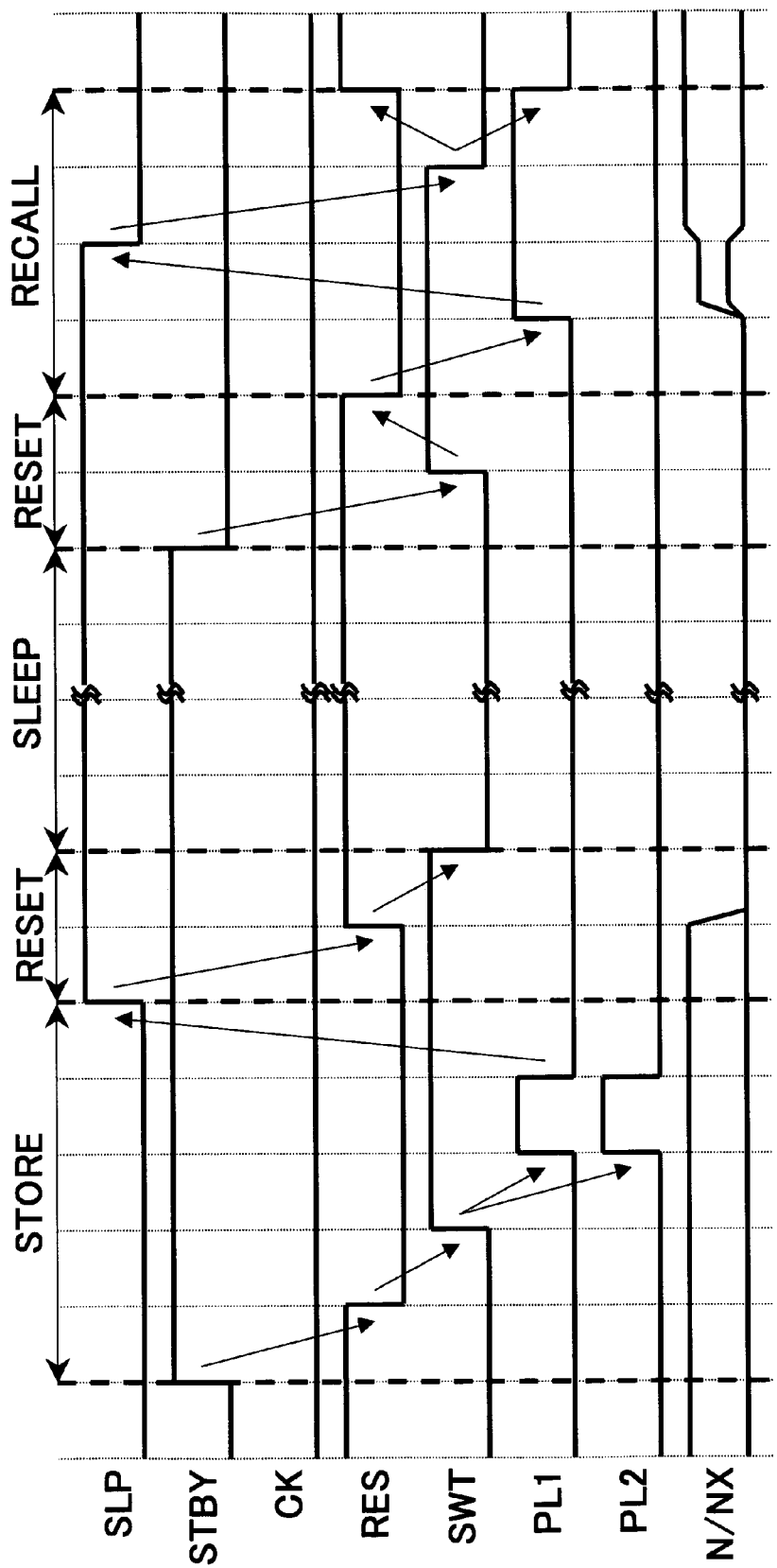
FIG. 15 is an operation waveform diagram of the nonvolatile latch circuit of this embodiment.

FIG. 15 is an operation waveform diagram of non-volatile latch circuit which also includes another nonvolatile latch circuit to be described below. Accordingly, control signals and the like not shown in FIG. 6 are included in FIG. 15. Operations of the nonvolatile latch circuit of FIG. 6 will be described with reference to FIG. 15. First, during active mode, the sleep signal SLP is at L level, the sleep switch SSW is in a conducting state, and a power supply voltage from the virtual power line VVdd is supplied to the combinational logic circuit 1 which is constituted by a low-Vth transistor and the inverters 11, 12, 15, 16 of the master latch circuit 10 and slave latch circuit 14.

In response to an external standby signal STBY reaching H level, the control signal generating circuit 5 drives a plate signal PL1 from L level, to H level, then L level. In response thereto, the polarization directions of the ferroelectric capacitors FC1, 2 is determined (programmed) in accordance with the level of the pair of storage terminals N2, NX2 of the slave latch circuit 14.

Figure 7:
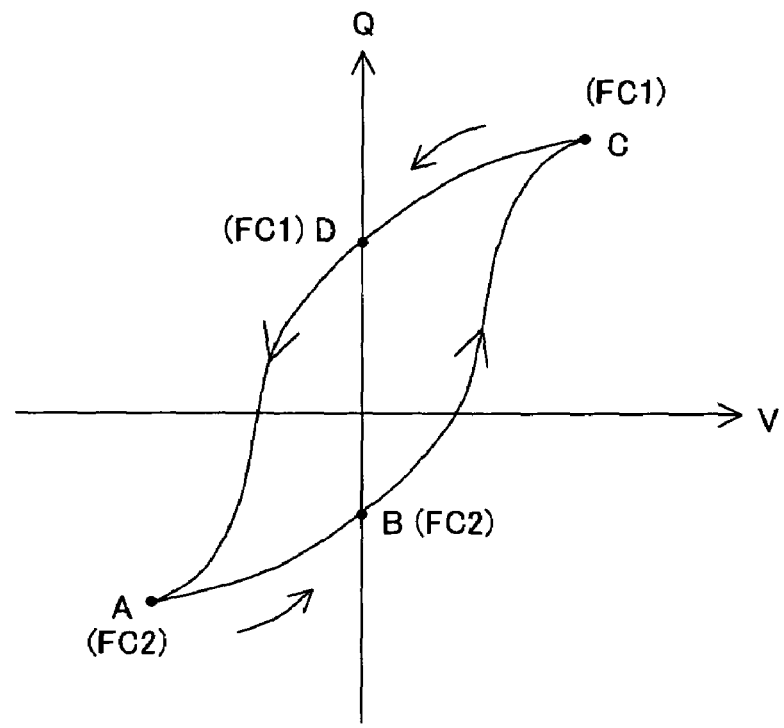
FIG. 7 is a view showing a polarizing action of a ferroelectric capacitor.

FIG. 7 is a view showing a polarization action of the ferroelectric capacitors. The abscissa shows a voltage V applied to the ferroelectric film and the ordinate shows a charge Q, thereby illustrating the hysteresis characteristic of a ferroelectric capacitor. It is assumed that the nodes N2 and NX2 of the slave latch circuit 14 are at L level and H level respectively. When the plate signal PL1 is at L level, a minus direction voltage is applied to the ferroelectric capacitor FC2, and thus the capacitor FC2 moves to a point A. No voltage is applied to the ferroelectric capacitor FC1, and therefore the capacitor FC1 is positioned at point D or point B, which is determined by previous data stored.

Then, when the plate signal PL1 reaches H level, a plus direction voltage is applied to the ferroelectric capacitor FC1 such that the capacitor FC1 moves to a point C. No voltage is applied to the ferroelectric capacitor FC2, and hence the capacitor FC2 moves from point A to point B. When the plate signal PL1 switches back to L level thereafter, no voltage is applied to the ferroelectric capacitor FC1, and therefore the capacitor FC1 moves from point C to point D, and the ferroelectric capacitor FC2 moves to point A. Thus, the ferroelectric capacitors FC1, FC2 are polarized in the different directions shown by the arrows in FIG. 6. Note that the direction of the arrows signifies that the electrode on the tip end side of the arrows is positively charged.

Hence the data in the slave latch circuit 14 are held by the polarization direction of the ferroelectric capacitors, and the store operation ends. The reset operation in FIG. 15 is an operation of another nonvolatile latch circuit to be described below. In the circuit in FIG. 6, the sleep signal SLP is switched to H level and sleep mode is entered. In sleep mode, the sleep switch SSW is in a non-conducting state, the power supply to the inverters 15, 16 is cut off, and the L, H level states of the storage nodes N2, NX2 volatize and disappear.

Thereafter, when the standby signal STBY reaches L level, a recall operation is performed. The control signal generating circuit 5 first switches the plate signal PL1 to H level so as to drive one of the terminals of the ferroelectric capacitors, whereupon voltages in accordance with the polarization directions of the capacitors are generated in the pair of storage terminals N2, NX2 of the slave latch circuit 14.

As shown in FIG. 7, when the plate signal PL1 reaches H level, a positive direction voltage is applied to the ferroelectric capacitors, causing the capacitor FC2 at point B to move to point C and the capacitor FC1 at point D to also move to point C. Thus in respect of the same voltage, the charge quantity Q of the capacitor FC2 is larger and the charge quantity Q of the capacitor FC1 is smaller. In other words, as regards the capacitance C of the two capacitors FC1, FC2, from the relationship C=Q/V, the capacitor FC1 has low capacitance (for example 50 fF) and the capacitor FC2 has high capacitance (for example 200 fF).

Figure 8:
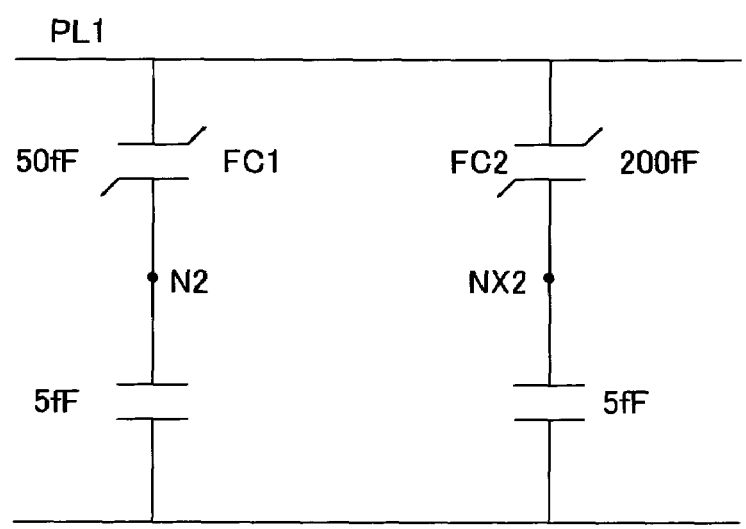
FIG. 8 is an equivalent circuit showing the capacitance connected to a pair of nodes N2, NX2 of a slave latch circuit.

FIG. 8 is an equivalent circuit showing the capacitance connected to the pair of nodes N2, NX2 of the slave latch circuit. A parasitic capacitance of 5 fF, for example, is presumed to exist in each node. In the equivalent circuit in FIG. 8, when the plate signal PL1 is at H level, for example a power supply voltage Vdd level of 3.3V, the node N2 becomes 3V (=3.3V×50 fF/(5 fF+50 fF) ), and the node NX2 becomes 3.22V (=3.3V×200 fF/(5 fF+200 fF)) in accordance with the ratio of the two capacitances. In other words, 3V and 3.22V are applied to the two nodes N2, NX2, thereby producing a 0.22V voltage difference between the nodes.

Then, as is shown in FIG. 15, when the control signal generating circuit 5 switches the sleep signal SLP to L level, the sleep switch SSW conducts, power is supplied to the slave latch circuit 14, and a latch enabled state is entered. As a result, the voltage difference between the nodes N2, NX2 is amplified and latched by the latch circuit 14.

When the latch circuit 14 drives the node N2 to L level and the node NX2 to H level, a positive direction voltage is applied to the ferroelectric capacitor FC1 such that the capacitor FC1 moves to point C of the hysteresis characteristic of FIG. 7. When the plate signal PL1 is then switched to L level, a negative direction voltage is applied to the ferroelectric capacitor FC2 such that the capacitor FC2 moves to point A. Hence the polarization directions of the two capacitors are rewritten in a direction in accordance with the level of the nodes N2, NX2 of the latch circuit 14.

As described above, during a data recall operation when active mode is returned to from sleep mode, the plate signal PL1 causes a voltage in accordance with the polarization direction of the ferroelectric capacitors to be generated in the pair of nodes N2, NX2 of the latch circuit 14, whereupon the sleep switch SSW conducts and the latch circuit is activated. As a result, data can be securely latched and restored.

Figure 9:
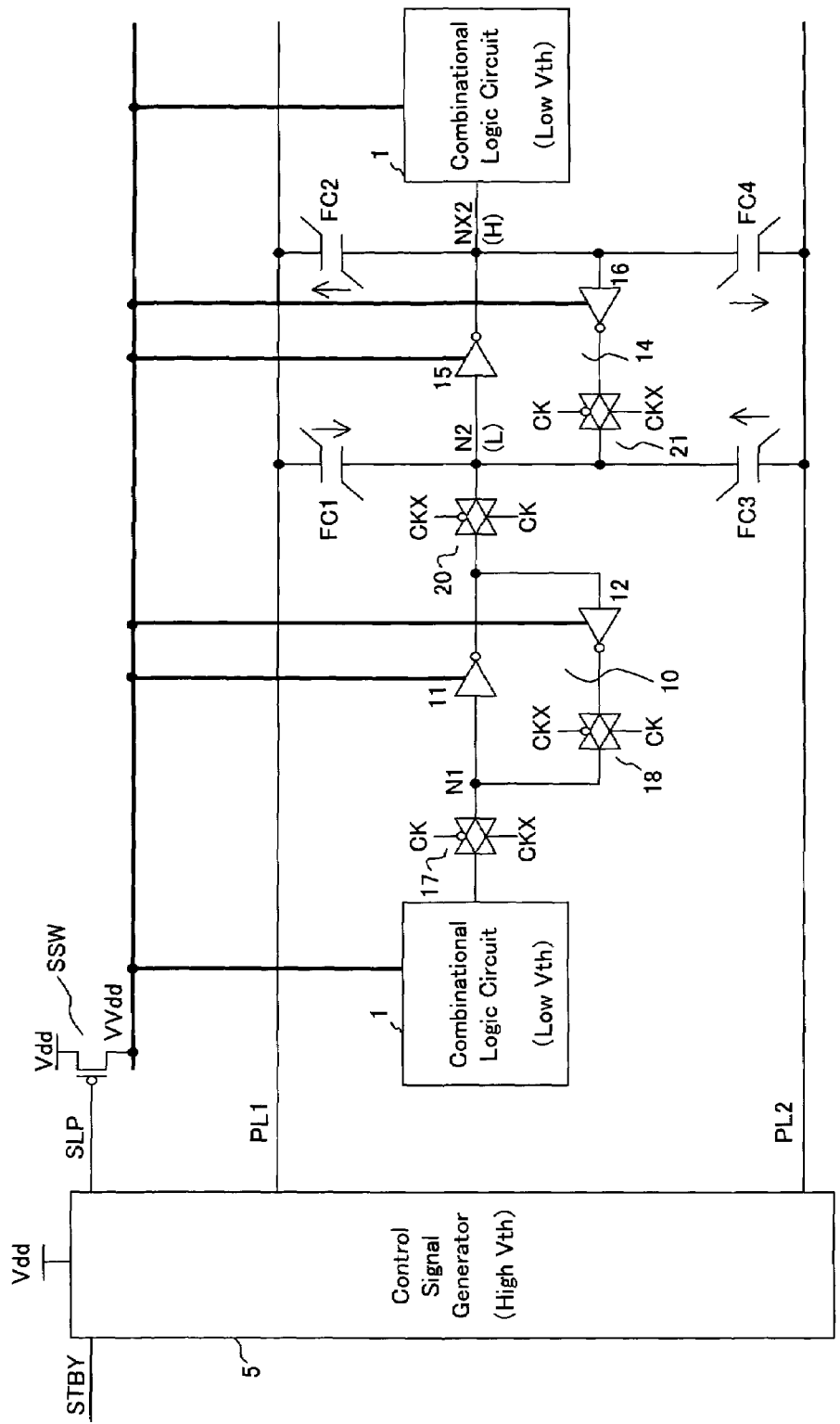
FIG. 9 is a circuit diagram showing another example of the nonvolatile latch circuit in FIG. 2.

FIG. 9 is a circuit diagram showing another example of the nonvolatile latch circuit and so on as shown in FIG. 2. The same reference numbers as FIG. 6 have been used. In addition to the circuit in FIG. 6, the circuit in FIG. 9 is provided with ferroelectric capacitors FC3, FC4 and a second plate signal PL2. The circuit is otherwise identical to that of FIG. 6, as is the CMOS inverter structure of the slave latch circuit 14.

Operations of the circuit in FIG. 9 will be described with reference to FIG. 15. During a store operation when sleep mode is entered, the first plate signal PL1 and second plate signal PL2 are both driven from L level, to H level, and then L level. Accordingly, the pair of ferroelectric capacitors FC1, FC3 connected to the node N2 are polarized in the same direction facing the node N2. Similarly, the pair of ferroelectric capacitors FC2, FC4 connected to the node NX2 are polarized in opposite directions to the node NX2.

Figure 10:
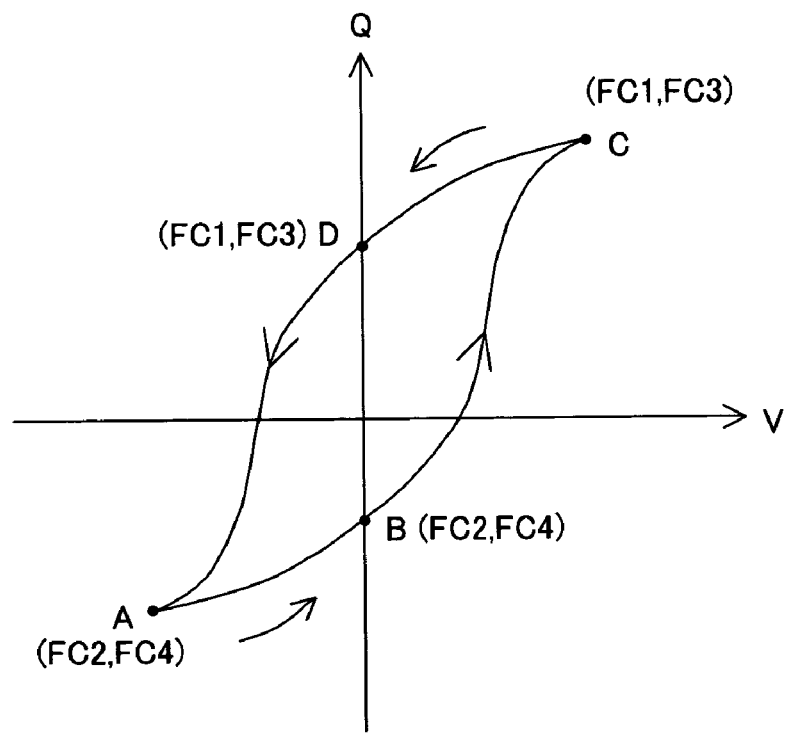
FIG. 10 is a view showing a polarizing action of the ferroelectric capacitor.

FIG. 10 is a view showing a polarization action of the ferroelectric capacitors. The first and second plate signals PL1, PL2 have the same waveform as in a store operation, and therefore the ferroelectric capacitors FC1, FC3 enter the same polarization direction state and the ferroelectric capacitors FC2, FC4 also enter the same polarization direction state. Hence the ferroelectric capacitors FC2, FC4 move to point A due to the H level of the node NX2, and move to point B due to the H level of the plate signals PL1, PL2. The ferroelectric capacitors FC1, FC3 move to point C due to the H level of the plate signals PL1, PL2, and move to point D due to the L level of the plate signal.

The sleep signal SLP then reaches H level such that the sleep switch SSW enters a non-conducting state and the circuits which are connected to the virtual power supply VVdd all enter a state of sleep.

When active mode is returned to from sleep mode, only the first plate signal PL1 is switched from L level to H level (power supply Vdd level), and the second plate signal PL2 is maintained at L level (ground Vss level). In other words, an opposite direction voltage to that during a store operation is applied to the ferroelectric capacitors FC3, FC4. Hence, in the graph in FIG. 10, the directions of the abscissa and ordinate are opposite. More specifically, when the first plate signal PL1 reaches H level and the second plate signal PL2 keeps L level, the ferroelectric capacitors FC1 and FC2 each move to point C, whereas the ferroelectric capacitors FC3 and FC4 each move to point A. That is, the capacitors FC1, FC2 have a capacitance relationship of FC1<FC2, whereas the capacitors FC3, FC4 have a capacitance relationship of FC3>FC4.

Figure 11:
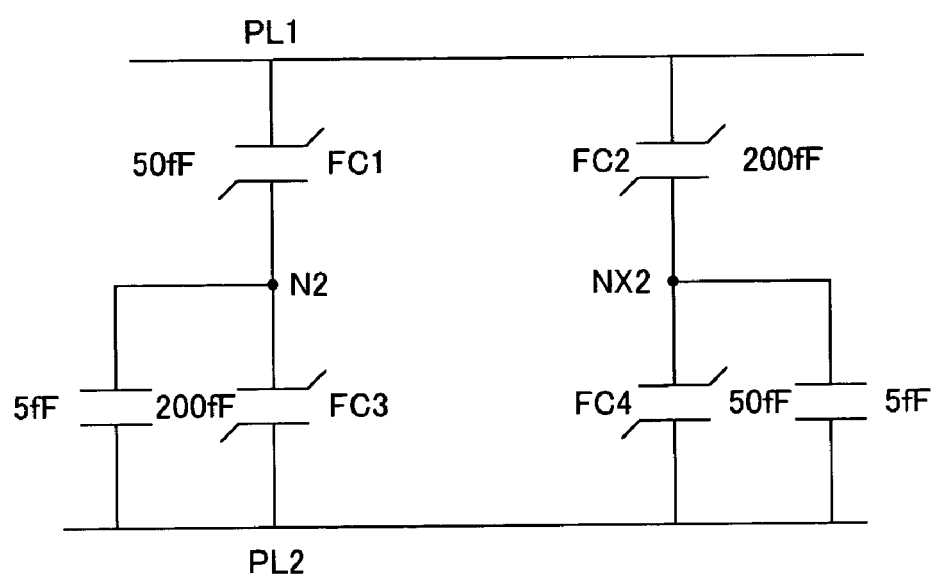
FIG. 11 is an equivalent circuit showing the capacitance connected to the pair of nodes N2, NX2 of the slave latch circuit.

FIG. 11 is an equivalent circuit of the capacitance connected to the pair of storage nodes N2, NX2 of the slave latch circuit 14. It is assumed that a parasitic capacitance of 5 fF is connected to the nodes N2, NX2. A capacitance with a relationship of FC1<FC3 is connected to the node N2, and a capacitance with a relationship of FC2>FC4 is connected to the node NX2. Hence if the first plate signal PL1 switches to H level, which is a Vdd level of 3.3V, the voltage of the node N2 becomes 0.65V (=3.3V×50 fF/(5 fF+50 fF+200 fF)) and the voltage of the node NX2 becomes 2.59V (=3.3V×200 fF/(5 fF+50 fF+200 fF)), and thus the voltage difference therebetween of 1.84V is much larger than that in FIG. 6.

By respectively connecting the pairs of ferroelectric capacitors FC1, FC3 and FC2, FC4 to the pair of terminals N2, NX2 of the latch circuit 14 in this manner, the voltage difference between the terminals N2, NX2 during a recall operation can be increased.

When the control signal generating circuit 5 switches the sleep signal SLP to L level from this state, the sleep switch SSW begins to conduct, the slave latch circuit 14 is activated, the voltage difference between the pair of nodes N2, NX2 is amplified, and the original data can be securely restored.

A modified example of a circuit having ferroelectric capacitors connected to the slave latch circuit 14 will now be described. In the following example, similarly to FIG. 9, a pair of ferroelectric capacitors is connected to each of a pair of nodes N2, NX2 of the latch circuit 14, and the first and second plate signals PL1, PL2 are applied to the opposite side electrode. Note, however, that this example is also applicable to a case such as that in FIG. 6, where a single ferroelectric capacitor is connected to each of the nodes of the latch circuit.

Figure 12:
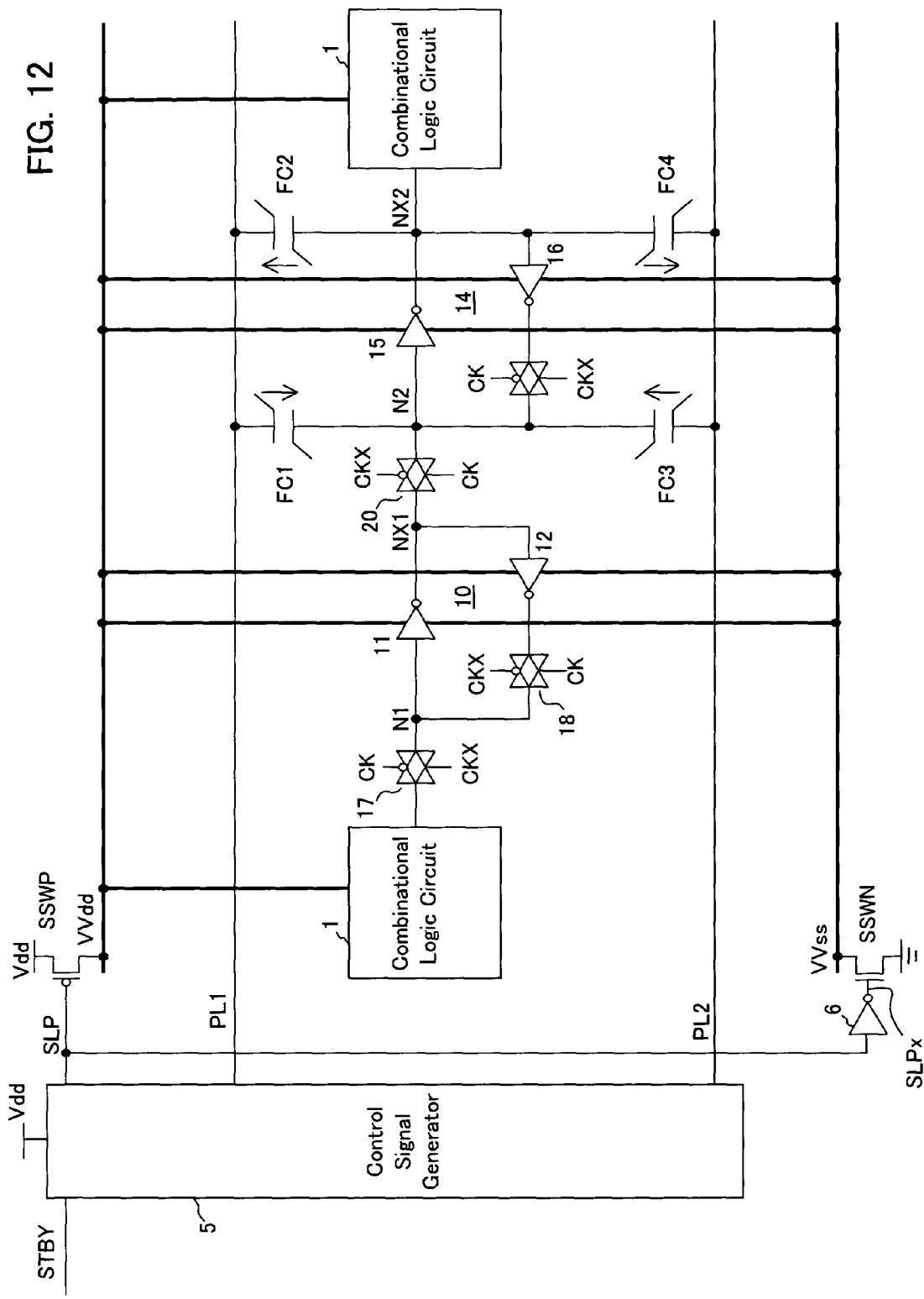
FIG. 12 is a circuit diagram of a first modified example in this embodiment.

FIG. 12 is a circuit diagram of a first modified example in this embodiment. In this modified example, in addition to the circuit in FIG. 9, a sleep switch SSWN and a virtual low voltage power supply VVss are also provided on the low power supply voltage Vss side, and the virtual low voltage power supply VVss is connected to an inverter of the master latch circuit 10 and the slave latch circuit 14. Hence a virtual high voltage power supply VVdd and a virtual low voltage power supply VVss are connected to the inverters 15, 16 of the slave latch circuit 14, which is a nonvolatile latch circuit. In other words, the sleep switch structure of FIG. 12 is the same as in FIG. 3.

In all other respects, this circuit is the same as the circuit in FIG. 9. During a store operation when sleep mode is entered, the first and second plate signals PL1, PL2 are driven from L level, to H level, then L level, as shown in FIG. 15, whereby the ferroelectric capacitors FC1 to FC4 are set in a state of polarization in accordance with the level of the nodes N2, NX2. During a recall operation when active mode is returned to from sleep mode, the first plate signal PL1 is driven to H level to generate in the nodes N2, NX2 a voltage difference in accordance with the polarization direction of the ferroelectric capacitors FC1 to FC4. Thereafter, the sleep signal SLP and the inverse signal thereof SLPx are driven to L level and H level respectively, whereby the sleep switches SSWP and SSWN are simultaneously caused to conduct, the slave latch circuit 14 is activated, and the voltage difference between the nodes N2, NX2 is amplified and latched.

Figure 13:
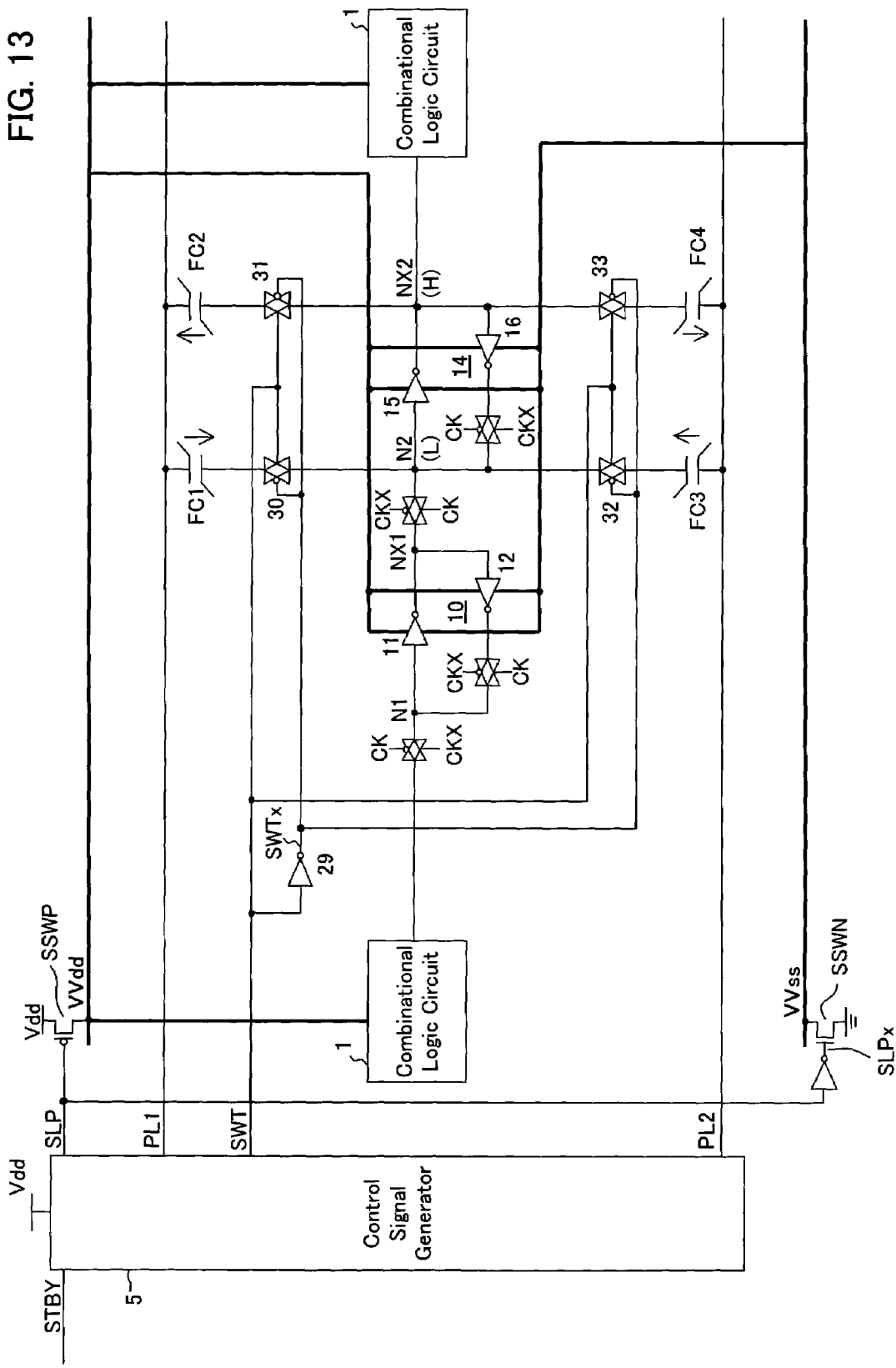
FIG. 13 is a circuit diagram of a second modified example in this embodiment.

FIG. 13 is a circuit diagram of a second modified example in this embodiment. In addition to the circuit in FIG. 12, in FIG. 13 switch circuits 30, 31 are provided between the ferroelectric capacitors FC1, FC2 and the slave latch circuit 14, and switch circuits 32, 33 are provided between the capacitors FC3, FC4 and the slave latch circuit 14. Thus the control signal generating circuit 5 generates a switch signal SWT which is supplied together with an inverse switch signal SWTx inverted by an inverter 29 to these switch circuits 30 to 33.

These switch circuits 30 to 33 are controlled to be non-conducting during normal operations, and separate the slave latch circuit 14 from the ferroelectric capacitors FC1 to FC4. Thus the load capacitance when the potential of the pair of nodes N2, NX2 inside the slave latch circuit 14 are driven to H level and L level can be reduced. Further, when the nodes N2, NX2 are driven, it is prevented that a voltage is applied to the ferroelectric film of the ferroelectric capacitors FC1 to FC4, thereby deteriorating in the material quality thereof.

Hence during a store operation when moving from active mode to sleep mode and during a recall operation when moving from sleep mode to active mode, the switch circuits 30 to 33 are caused to conduct, thereby enabling data from the latch circuit 14 to be stored and data from the ferroelectric capacitors to be recalled to the latch circuit 14.

In the circuit operation of FIG. 13, as shown in FIG. 15, the switch signal SWT is driven to H level during a store operation and a recall operation, whereby the switch circuits 30 to 33 are controlled to a conducting state and the ferroelectric capacitors FC1 to FC4 are connected to the pair of nodes N2, NX2 of the latch circuit 14. At other times, the switch signal SWT is set at L level, whereby the switch circuits are controlled to a non-conducting state and the ferroelectric capacitors are separated from the latch circuit nodes.

Figure 14:
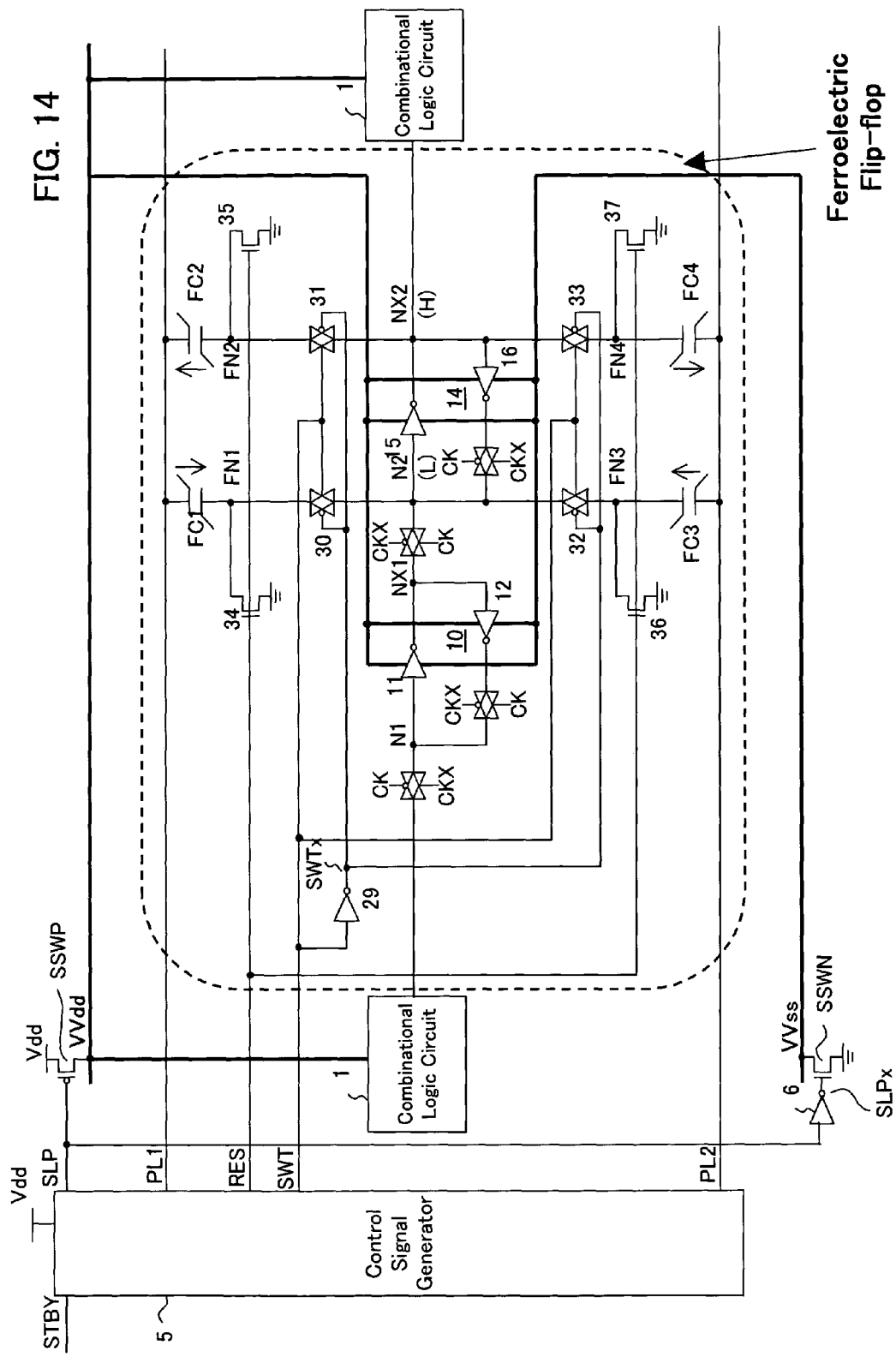
FIG. 14 is a circuit diagram of a third modified example in this embodiment.

FIG. 14 is a circuit diagram of another modified example in this embodiment. In this circuit, in addition to the circuit in FIG. 13, reset transistors 34, 35 are connected to the ferroelectric capacitors FC1, FC2, and reset transistors 36, 37 are connected to the ferroelectric capacitors FC3, FC4. A reset signal RES for controlling these transistors is generated by the control signal generating circuit 5. Otherwise, the constitution of this circuit is identical to the circuit in FIG. 13.

The reset transistors 34 to 37 are each controlled to a conducting state state prior to a store operation when moving from active mode to sleep mode, and prior to a recall operation when moving from sleep mode to active mode. As a result, nodes FN1 to FN4 of the ferroelectric capacitors FC1 to FC4 are set at ground level so that no superfluous noise level remains in these nodes FN1 to FN4. In the case of an integrated circuit, signal wires are provided around the nodes via insulating film, and a predetermined voltage level may be generated in the nodes FN1 to FN4 by coupling noise from these signal wires. By causing the reset transistors 34 to 37 to conduct, the effect of this coupling noise is suppressed.

The circuit operation of FIG. 14 will be described using the operation waveform diagram of FIG. 15. In response to the H level of the standby signal STBY when in active mode, the reset signal RES is set at L level and all of the reset transistors 34 to 37 are set in a non-conducting state. As a result, the ferroelectric capacitor nodes FN1 to FN4 switch from ground level to a floating state. The switch signal SWT is then controlled to H level and the switch circuits 30 to 33 are set in a conducting state. In this state, the first and second plate signals PL1, PL2 are driven from L level, to H level, then L level. Thus the polarization directions of the ferroelectric capacitors FC1 to FC4 are set in the directions of the arrows in FIG. 14 in accordance with the voltage level of the pair of nodes N2, NX2 of the latch circuit 14. At this point, the store operation ends.

The sleep signal SLP is then driven to H level such that both of the sleep transistors SSWP, SSWN become non-conducting, the combinational logic circuit 1 and the latch circuits 10, 14 both constituted by a low-Vth transistor cease operations, and sleep mode is entered. During the sleep mode period, the reset signal RES is switched to H level such that the reset transistors are maintained in a conducting state, and the switch signal SWT is switched to L level such that the switch circuits 30 to 33 are maintained in a non-conducting state. Note, however, that in sleep mode, the reset transistors may also be held in a non-conducting state. In that case, the reset transistors are switched to a conducting state when leaving sleep mode.

When returning to active mode from sleep mode, the standby signal STBY is switched to L level. In response thereto, the control signal generating circuit 5 sets the switch signal SWT to H level such that the switch circuits 30 to 34 enter a conducting state and the ferroelectric capacitor nodes FN1 to FN4 are set at ground level together with the nodes N2, NX2 of the slave latch circuit 14 via the reset transistors 34 to 37. Thus a reset operation is performed. The control signal generating circuit 5 then sets the reset signal RES to L level such that the reset transistors 34–37 enter a non-conducting state. As a result, the nodes N2, NX2 enter a floating state.

Thereafter, a recall operation is begun, and thus the control signal generating circuit 5 drives the first plate signal PL1 to H level and maintains the second plate signal PL2 at ground level. As a result, a power supply voltage is applied between the ferroelectric capacitor pair FC1, FC3, and a power supply voltage is likewise applied between the other ferroelectric capacitor pair FC2, FC4. Thereby, the aforementioned voltage difference is generated between the pair of nodes N2, NX2 of the slave latch circuit 14. In this state, the control signal generating circuit 5 drives the sleep signal SLP to L level and causes the two sleep transistors SSWP, SSWN to conduct simultaneously such that the slave latch circuit 14 is activated. Hence the voltage difference between the nodes N2, NX2 is amplified and the original data are latched.

The switch signal SWT is then set at L level such that the switch circuits 30 to 33 become non-conducting, whereupon the plate signal PL1 is returned to L level such that a state of polarization in accordance with the data latched by the latch circuit 14 is generated in the ferroelectric capacitors FC1, FC2. Since the switch circuits 30 to 33 are in a non-conducting state, the H level of the node NX2 of the latch circuit 14 does not fall due to coupling of the capacitor FC2 even when the plate signal PL1 is returned to L level.

As described above, by providing the switch circuits 30 to 33 and the reset transistors 34 to 37 in the circuit in FIG. 14, the store operation and recall operation can be made more secure.

The nonvolatile latch circuit constitution described above may also be provided on the master latch circuit 10 side. Depending on the latch circuit from which data are to be sheltered or evacuated, a data evacuation structure can be disposed selectively using the ferroelectric capacitors. Moreover, ferroelectric capacitors may be provided in both the master latch circuit 10 and the slave latch circuit 14. In either case, a nonvolatile flip-flop circuit is constructed by a master latch circuit and a slave latch circuit.

Figure 16:
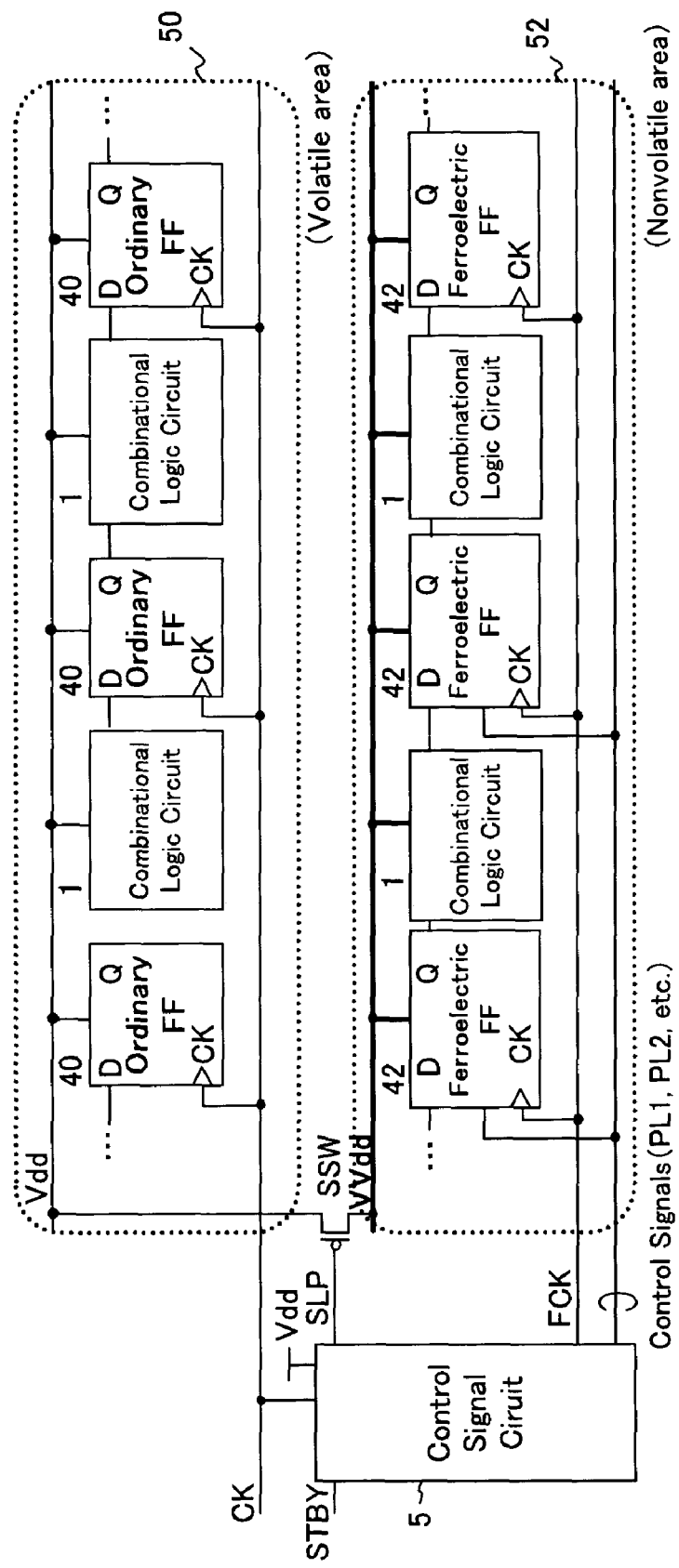
FIG. 16 is a view showing an example of the overall constitution of the integrated circuit in this embodiment.

FIG. 16 is a view showing an overall constitutional example of the integrated circuit in this embodiment. The integrated circuit in FIG. 16 is provided with a nonvolatile region 52 in which flip-flop data can be stored during sleep mode, and a volatile area 50 in which data cannot be stored. A normal power supply Vdd is supplied to the combinational logic circuits 1 and flip-flops 40 in the volatile region 50 at all times, and control is not performed to sleep mode. A virtual power supply VVdd is supplied to the combinational logic circuits 1 and flip-flops 42 in the nonvolatile region 52, and thus this region may be controlled to sleep mode. Accordingly, the aforementioned ferroelectric capacitor circuits are annexed to the flip-flops 42 inside the nonvolatile region 52 such that during sleep mode, the data held in the flip-flops can be stored in the ferroelectric capacitors thereof. As described above, these flip-flops are provided with latch circuits.

A clock CK is supplied to the flip-flops 40 inside the volatile region 50 at all times. Thus the data processed and generated by the combinational logic circuit 1 are held in the respective flip-flops 40 and supplied as input signals of the next combinational logic circuit 1.

Meanwhile, a clock FCK is supplied to the flip-flops 42 inside the nonvolatile region 52. However, this clock FCK stops when the nonvolatile region 52 is in sleep mode. More precisely, as shown in FIG. 15, the clock FCK stops from the standby signal STBY reaching H level to the end of the recall operation.

The control signal generating circuit 5 supplies the clock FCK and control signals (the plate signal, switch signal, reset signal, and so on) to the flip-flops 42 provided with the plurality of ferroelectric capacitors. The control signal generating circuit 5 also generates the sleep signal SLP in order to control a sleep transistor SSW which is provided in common to the circuits comprising low-Vth transistors inside the nonvolatile region 52.

Figure 17:
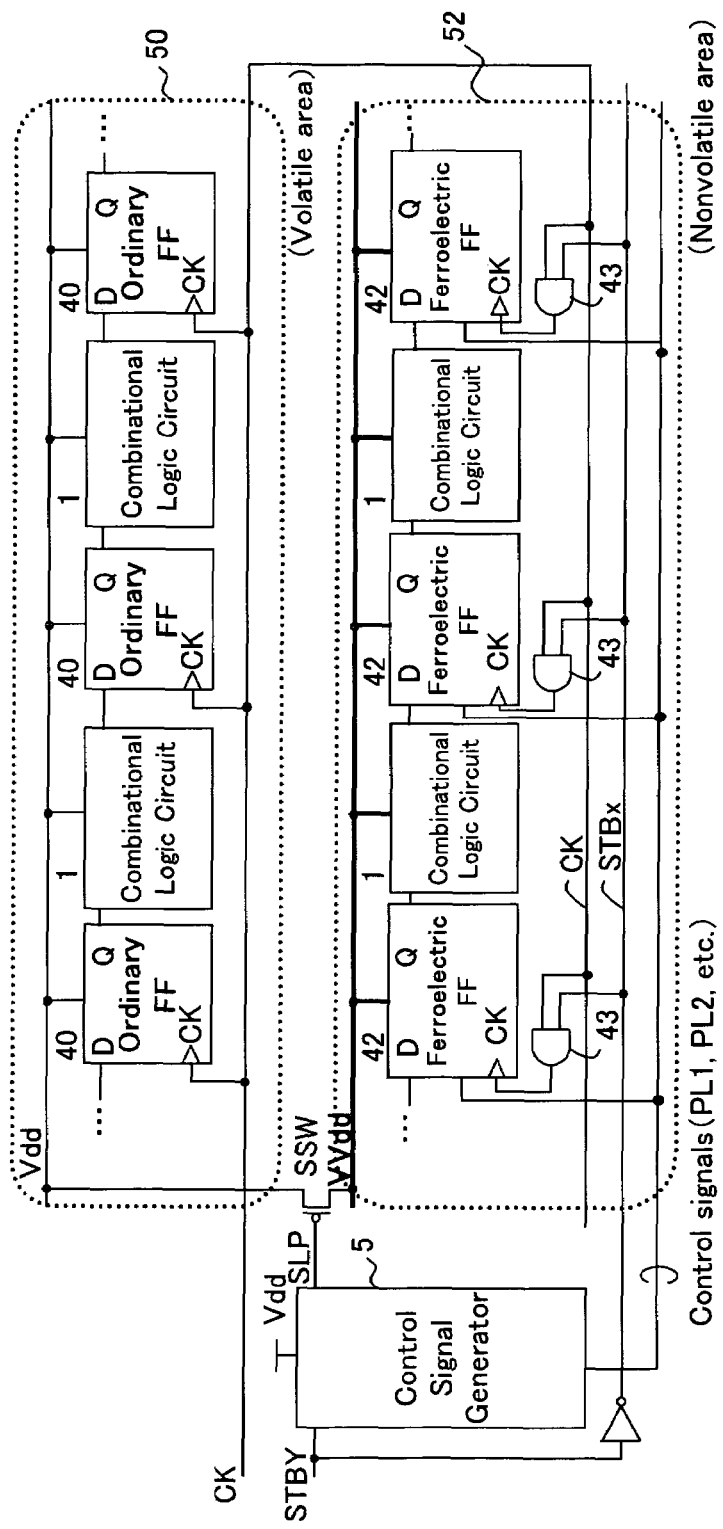
FIG. 17 is a view showing another example of the overall constitution of the integrated circuit in this embodiment.

FIG. 17 is a view showing another overall constitutional example of the integrated circuit in this embodiment. The example in FIG. 17 is also provided with the volatile region 50 and nonvolatile region 52, but differs from FIG. 16 in that the clock supplied to the flip-flops 42 inside the nonvolatile region 52 is generated by the logical product of the normal clock CK and the inverse signal STBYX of the standby signal STBY. Accordingly, each flip-flop 42 is provided with an AND gate 43. In the example in FIG. 16, this AND gate is provided in the control signal generating circuit 5, whereas in the example in FIG. 17, an AND gate 43 is provided for each flip-flop 42 inside the nonvolatile region 52. The disposal positions of the AND gates 43 are defined according to the layout circumstances.

Figure 18:
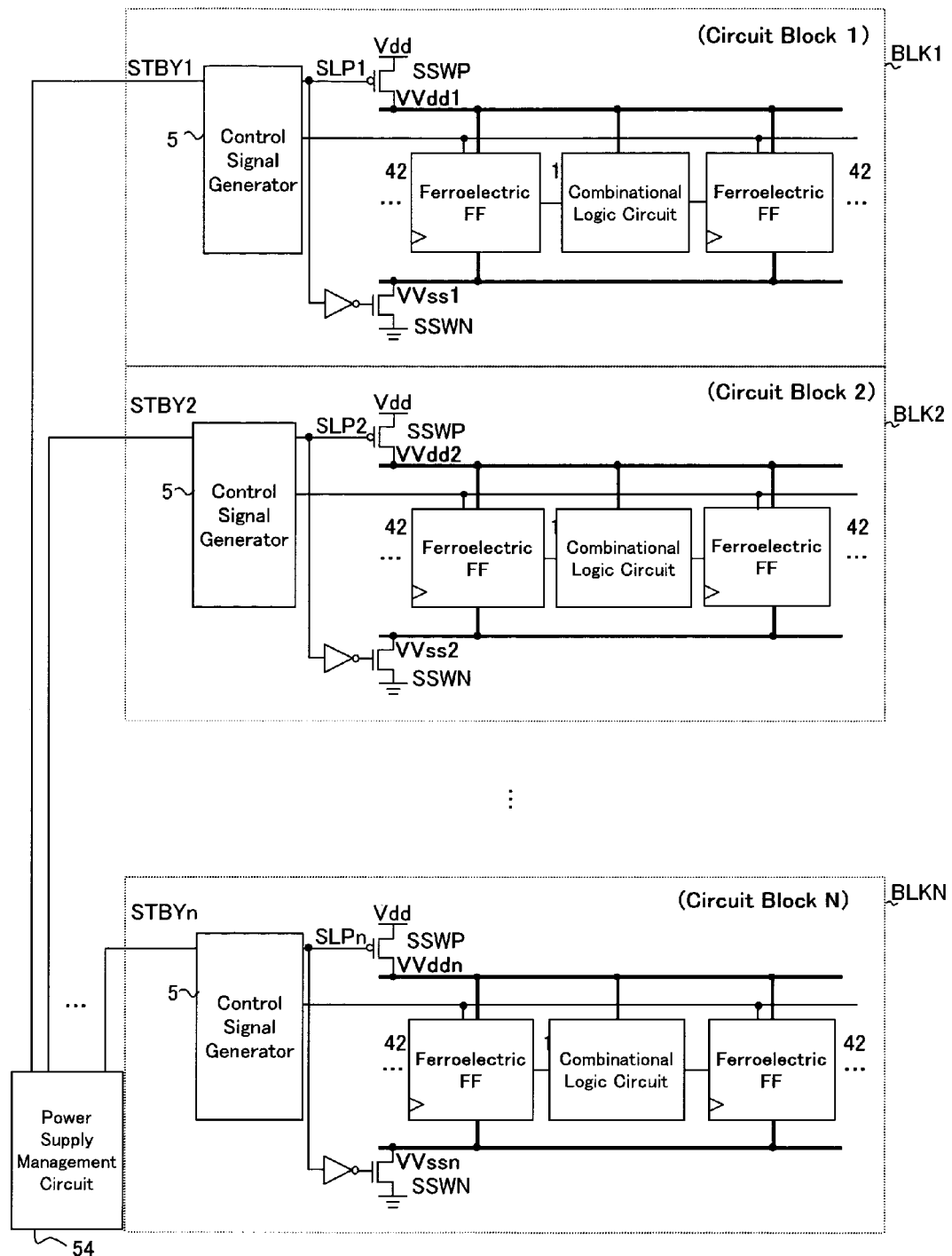
FIG. 18 is a view showing a further example of the overall constitution of the integrated circuit in this embodiment.

FIG. 18 is a view showing a further overall constitutional example of the integrated circuit in this embodiment. In the example in FIG. 18, a plurality of volatile circuit blocks BLK1 to BLKN are provided, and a pair of sleep switches SSWP, SSWN and the control signal generating circuit 5 are provided in each circuit block. Other standby signals STBY1 to STBYn are respectively supplied to the control signal generating circuit 5 within each circuit block from a power supply management circuit 54. The internal structure of each circuit block is identical to the structure shown in FIGS. 12, 13, and 14.

Hence, when the power supply management circuit 54 supplies a desired circuit block with an L level standby signal, that circuit block may be moved to sleep mode, and when an H level standby signal is supplied to a specific circuit block, that circuit block may be returned to active mode. Thus, by controlling circuit blocks in which operations are not required to sleep mode and setting circuit blocks in which operations are required to an active state, the power supply management circuit 54 is capable of economizing on power consumption. Moreover, data in the flip-flops and latch circuits inside circuit blocks in sleep mode may be maintained by ferroelectric capacitor circuits, and thus these flip-flops and latch circuits can be a substantially nonvolatile circuit.

Figure 19:
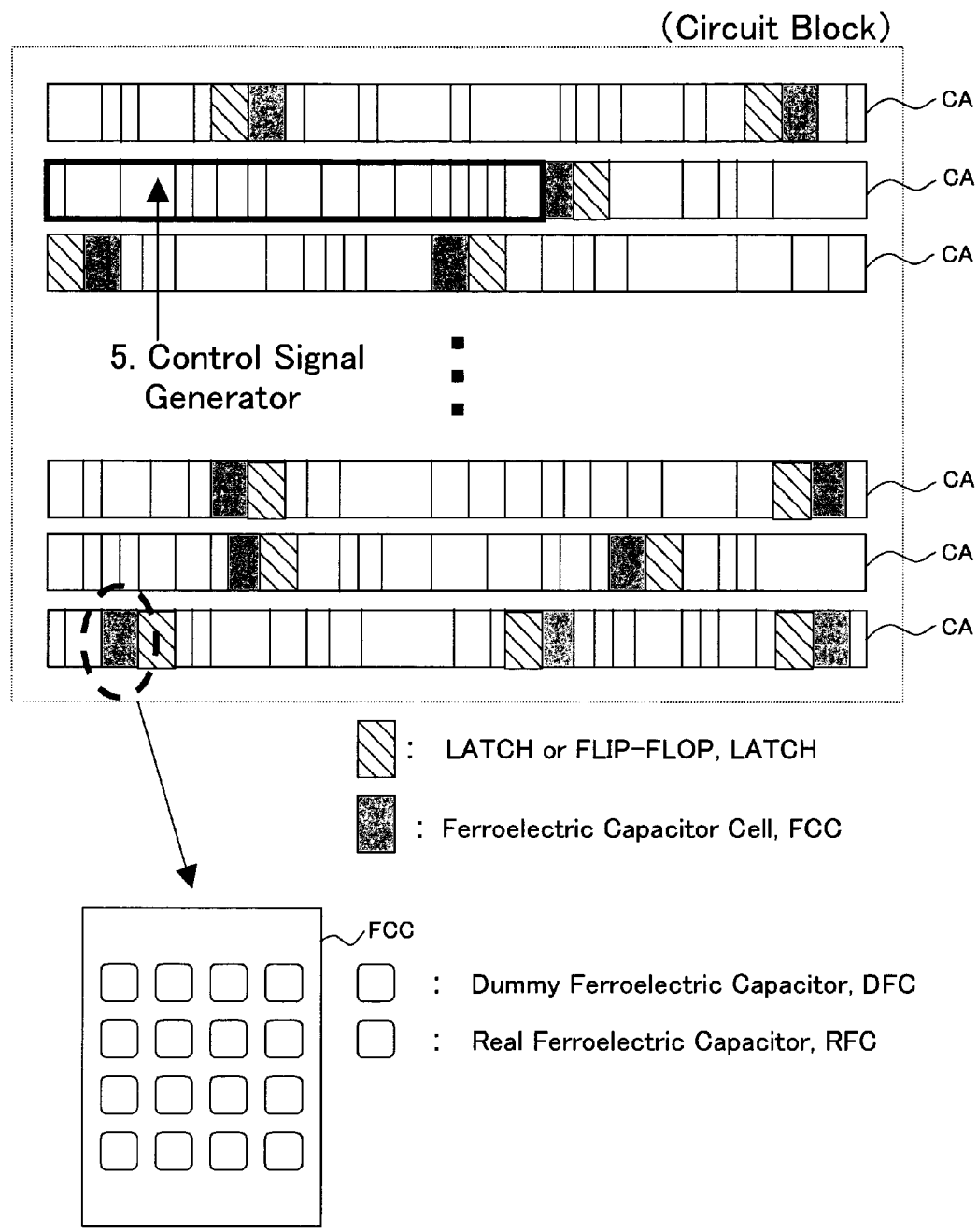
FIG. 19 is a view showing an example of the layout of a circuit block in this embodiment.

FIG. 19 is a view showing an example of the layout of a circuit block in this embodiment. This circuit block has a cell array configuration such as ASIC (Application Specific Integrated Circuit) having a plurality of cells laid out on a plurality of cell arrays CA. In the plurality of cells in the cell arrays, nonvolatile latch circuits or nonvolatile flip-flops LATCH, illustrated by the diagonally shaded blocks, are disposed adjacent to ferroelectric capacitor cells FCC, illustrated by gray blocks. In so doing, data stored in the nonvolatile latches or flip-flop circuits may be stored in the ferroelectric capacitor cells FCC.

As shown in FIG. 19, the nonvolatile latch circuits and so on and the ferroelectric capacitor cells FCC for holding the data therein are dispersed throughout the circuit blocks, and the control signal generating circuit 5 for supplying control signals to the ferroelectric capacitor cells is formed in the second row cell array. Hence the control signals, not shown, are respectively laid out from the control signal generating circuit 5 to the dispersed ferroelectric capacitor cells FCC. The control signal generating circuit 5 may be formed dispersed over a plurality of locations.

As shown in FIGS. 12, 13, and 14, the ferroelectric capacitor cells FCC are provided with four ferroelectric capacitors FC. In the example in FIG. 19, the ferroelectric capacitor configuration is provided with dummy ferroelectric capacitors DFC on the periphery of the four real ferroelectric capacitors RFC in order to lessen the effect of irregularities caused by discontinuity in the manufacturing process. Accordingly, during the manufacturing process the effect of structural irregularities caused by discontinuity in layout is mainly absorbed by the peripheral dummy ferroelectric capacitors RFC, for example, and thus this effect can be reduced. Since structural irregularities do not affect the inner four real ferroelectric capacitors RFC, the data holding characteristic of these capacitors can be improved.

Figure 20:
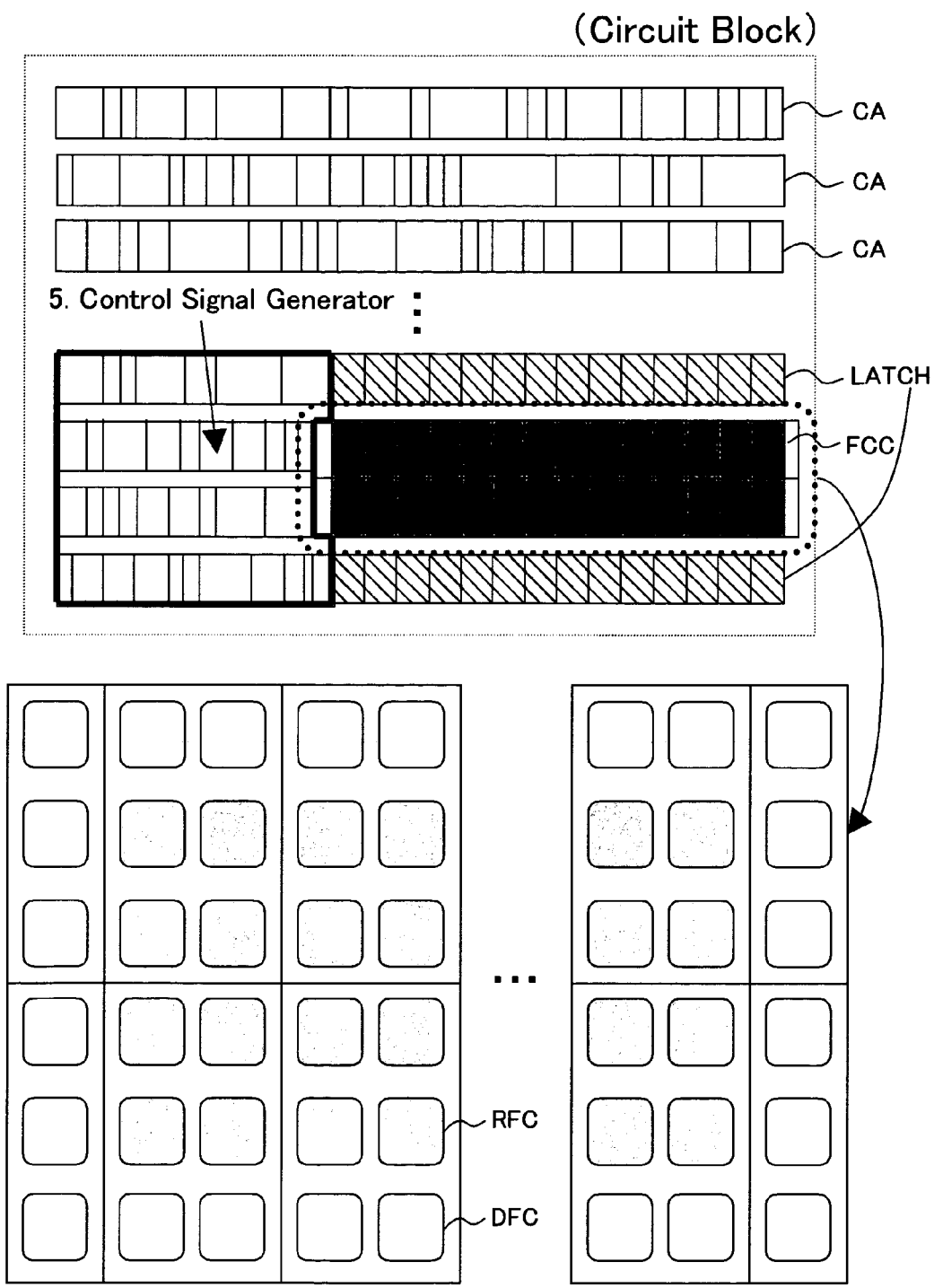
FIG. 20 is a view showing another example of the layout of a circuit block in this embodiment.

FIG. 20 is a view showing another example of the layout of a cell block in this embodiment. This cell block is also provided with a plurality of cells laid out on a plurality of cell arrays CA, but differs from FIG. 19 in that the nonvolatile latch circuits LATCH, illustrated by diagonally shaded blocks, are concentrated in two cell array rows. In accordance therewith, the ferroelectric capacitor cells FCC are also disposed in concentration adjacent to the nonvolatile latch circuits. The control signal generating circuit 5 for supplying control signals to the ferroelectric capacitor cells is disposed adjacent to the ferroelectric capacitor cells FCC. In so doing, control signal wiring can be shortened.

As shown in FIG. 20, the ferroelectric capacitor cells FCC are comprised of dummy ferroelectric capacitors DFC disposed on the periphery of the real ferroelectric capacitors RFC. As a result, the effect of irregularities caused by discontinuity in the manufacturing process can be reduced. In the example in FIG. 20, the ferroelectric capacitor cells are disposed in concentrated fashion, and thus in comparison with FIG. 19, the number of dummy ferroelectric capacitors DFC can be reduced.

The layouts in FIG. 19 and FIG. 20 are preferably to be selected appropriately and selectively within the same circuit block, and the most suitable layout method should be selected on a case by case basis.

According to this embodiment as described above, sleep transistors are used to halt power supply to a circuit group constituted by low-Vth transistors during sleep mode so that leakage current therein can be suppressed, and the sleep transistors are also used to activate a latch circuit during the recall of data from a ferroelectric capacitor to a nonvolatile latch circuit when returning to active mode from sleep mode. By using a ferroelectric capacitor as a balloon latch circuit for holding data, the power line layout can be simplified and a latching operation by the latch circuit during data recall can be performed more surely.

Note that the nonvolatile latch circuit of the aforementioned embodiment may be made into static memory by disposing a plurality thereof in a matrix. Alternatively, the nonvolatile latch circuit may be used as a flip-flop, counter, register and so on by disposal thereof in series.

According to the present invention as described above, in an MTCMOS integrated circuit, power line can be simplified and the degree of integration can be improved. Further, operations of a latch circuit when returning to active mode from sleep mode can be stabilized.

What is claimed is:

1. An integrated circuit, comprising:
   a sleep switch, provided between a first power supply line and a second power supply line, which is constituted by a transistor of a first threshold voltage, and which becomes non-conducting in a sleep mode;
   a latch circuit, connected to said second power supply line, which is constituted by a transistor of a second threshold voltage which is lower than said first threshold voltage;
   a ferroelectric capacitor for storing data held in said latch circuit in accordance with polarization direction of a ferroelectric film thereof; and
   a control signal generating circuit which, when returning to an active mode from said sleep mode, generates a plate signal for driving a terminal of said ferroelectric capacitor to generate a voltage in said latch circuit in accordance with the polarization direction, and generates a sleep signal for causing said sleep switch to conduct to thereby activate said latch circuit following the driving of said ferroelectric capacitor.

2. An integrated circuit comprising:
   a sleep switch, provided between a first power supply line and a second power supply line, which is constituted by a transistor of a first threshold voltage, and which becomes non-conducting in a sleep mode, the first and second power supply lines and the sleep switch being provided on each of a high power supply line side and a low power supply line side:
   a latch circuit, connected to the second power supply line on said high power supply line side and the second power line on said low power supply line side, which is constituted by a transistor of a second threshold voltage which is lower than said first threshold voltage;
   a ferroelectric capacitor for storing data held in said latch circuit in accordance with polarization direction of a ferroelectric film thereof; and
   a control signal generating circuit which, when returning to an active mode from said sleep mode, generates a plate signal for driving a terminal of said ferroelectric capacitor to generate a voltage in said latch circuit in accordance with the polarization direction, and generates a sleep signal for causing the pair of sleep switches on said high power supply line side and low power supply line side to conduct to thereby activate said latch circuit following the driving of said ferroelectric capacitor.

3. The integrated circuit according to claim 1 or claim 2, wherein said ferroelectric capacitor comprises at least a pair of ferroelectric capacitors, one terminal of each of the ferroelectric capacitors being connected respectively to a pair of storage terminals of said latch circuit, and
   said plate signal is supplied to the other terminals of said ferroelectric capacitors such that a voltage in accordance with the polarization direction of said ferroelectric capacitors is generated in a pair of storage terminals of said latch circuit.

4. The integrated circuit according to claim 1 or claim 2, wherein said ferroelectric capacitor comprises a pair of ferroelectric capacitors, one terminal of each of the ferroelectric capacitors of the ferroelectric capacitor pair being connected respectively to a pair of storage terminals of said latch circuit, and
   the other terminals of one of the ferroelectric capacitors of the ferroelectric capacitor pair connected to the pair of storage terminals of said latch circuit are driven by a plate signal such that a voltage in accordance with the polarization direction of the ferroelectric capacitors of the ferroelectric capacitor pair connected to each storage terminal is generated in the pair of storage terminals of said latch circuit respectively.

5. The integrated circuit according to claim 3, wherein said plate signal is supplied to the other terminals of said ferroelectric capacitors when said sleep mode is entered such that said ferroelectric capacitor is set in a predetermined state of polarization in accordance with the voltage level of the pair of storage terminals of said latch circuit.

6. The integrated circuit according to claim 4, wherein said plate signal is supplied to the other terminal of said one of the ferroelectric capacitor pair when said sleep mode is entered such that said ferroelectric capacitors of the ferroelectric capacitor pair is set in a predetermined state of polarization in accordance with the voltage level of the pair of storage terminals of said latch circuit.

7. The integrated circuit according to claim 1 or claim 2, further comprising a switch circuit, provided between said ferroelectric capacitor and said latch circuit, which enters a conducting state when said active mode is returned to from said sleep mode and enters a non-conducting state during said active mode.

8. The integrated circuit according to claim 7, wherein when said active mode is returned to from said sleep mode, said switch circuit conducts to connect between said latch circuit and said ferroelectric capacitor.

9. The integrated circuit according to claim 1 or claim 2, further comprising a reset circuit, provided on one terminal of said ferroelectric capacitor, which enters a conducting state when said active mode is returned to from said sleep mode, to reset the level of said one terminal of said ferroelectric capacitor to a predetermined level.

10. The integrated circuit according to claim 9, wherein said one terminal enters a floating state following resetting by said reset circuit, whereupon said plate signal is supplied.

11. The integrated circuit according to claim 9, wherein said reset circuit enters a conducting state when said sleep mode is moved to from said active mode such that the level of said one terminal of said ferroelectric capacitor is reset to a predetermined level.

12. The integrated circuit according to claim 1, further comprising:
- a nonvolatile region having a nonvolatile latch circuit including said latch circuit and said ferroelectric capacitor; and
- a volatile region having a volatile latch circuit including said latch circuit but not annexed with said ferroelectric capacitor,
- wherein a clock which halts during said sleep mode is supplied to the latch circuit of said nonvolatile region.

13. The integrated circuit according to claim 1, further comprising:
- a nonvolatile region having a nonvolatile latch circuit including said latch circuit and said ferroelectric capacitor; and
- a volatile region having a volatile latch circuit including said latch circuit but not annexed with said ferroelectric capacitor,
- wherein each latch circuit of said nonvolatile region is provided with a clock gate circuit for supplying a clock in accordance with a sleep mode control signal.

14. The integrated circuit according to claim 1, further comprising:
- a plurality of circuit blocks,
- wherein each circuit block is respectively provided with said sleep switch, said latch circuit, said ferroelectric capacitor, and said control signal generating circuit, and further comprising:
- a power supply management circuit for supplying sleep mode control signals respectively to said control signal generating circuit.

15. The integrated circuit according to claim 1, wherein said latch circuits and the ferroelectric capacitors annexed thereto are disposed in dispersed locations, and said plate signal is supplied to these dispersed ferroelectric capacitors.

16. The integrated circuit according to claim 1, wherein said latch circuits and the ferroelectric capacitors annexed thereto are disposed in concentration, and said control signal generating circuit is disposed close to the concentrated latch circuit group and ferroelectric capacitor group.

17. The integrated circuit according to claim 1, wherein said ferroelectric capacitor comprises a real capacitor for storing the storage terminal level of said latch circuit according to the polarization direction, and dummy capacitors disposed on the periphery of the real capacitor.

18. An integrated circuit comprising:
- a sleep switch, provided between a first power line and a second power line, which is constituted by a transistor of a first threshold voltage, and which becomes non-conducting in a sleep mode;
- a latch circuit, connected to said second power line, which is constituted by a transistor of a second threshold voltage which is lower than said first threshold voltage;
- a combinational circuit, connected to said second power line, which is constituted by a transistor of said second threshold voltage;
- a nonvolatile data holding circuit for storing data held by said latch circuit during said sleep mode; and
- a control signal generating circuit which, when returning to an active mode from said sleep mode, generates a recall signal for generating a voltage in said latch circuit in accordance with the state of said nonvolatile data holding circuit, and thereafter generates a sleep signal for causing said sleep switch to conduct to thereby activate said latch circuit.

* * * * *